United States Patent [19]

Hall et al.

[11] Patent Number: 4,703,270
[45] Date of Patent: Oct. 27, 1987

[54] ZERO QUANTUM NMR IMAGING AND SPECTROSCOPY IN A LOW HOMOGENEITY MAGNETIC FIELD

[75] Inventors: Laurance D. Hall, Cambridge, England; Timothy J. Norwood, Vancouver, Canada

[73] Assignee: The University of British Columbia, Vancouver, Canada

[21] Appl. No.: 853,447

[22] Filed: Apr. 18, 1986

[51] Int. Cl.⁴ ............................................. G01R 33/20
[52] U.S. Cl. ..................................... 324/309; 324/310
[58] Field of Search ................ 324/307, 309, 310, 311

[56] References Cited

U.S. PATENT DOCUMENTS 4,134,058 1/1979 Ernst ..................................... 324/307
4,238,735 12/1980 Muller ................................. 324/310
4,510,449 4/1985 Ernst et al. ........................... 324/309

Primary Examiner—Jerry W. Myracle
Assistant Examiner—Kevin D. O'Shea
Attorney, Agent, or Firm—Chernoff, Vilhauer, McClung & Stenzel

[57] ABSTRACT

Zero-quantum nuclear magnetic resonance imaging and spectroscopy in an inhomogeneous or low homogeneity magnetic field are disclosed. Specific pulse sequences have been developed which produce zero-quantum coherence resolved images and spectra. Unlike conventional NMR resolved images and spectra the zero-quantum coherence resolved images and spectra are unaffected by magnetic field inhomogeneity, thereby allowing the images and spectra of substances to be obtained where magnetic field inhomogeneity would previously have made it impossible.

8 Claims, 32 Drawing Figures

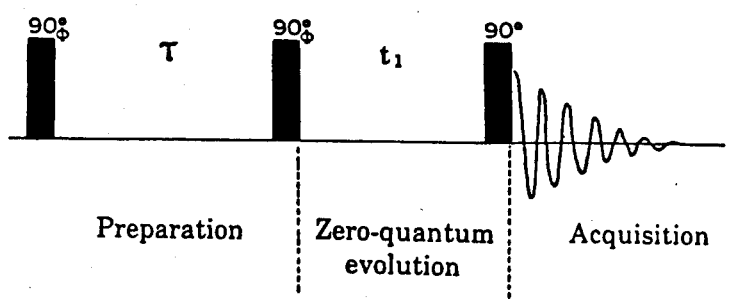
FIG. 2.1
TABLE 2.1
| Pulse phase φ | 0° | 90° | 180° | 270° | Orders selected |
|---|---|---|---|---|---|
| Receiver phase | 0° | | | | 0 1 2 3 4 5 6 7 8 |
| | 0° | | 0° | | 0 2 4 6 8 |
| | 0° | | 180° | | 1 3 5 7 |
| | 0° | 0° | 0° | 0° | 0 4 8 |
| | 0° | 180° | 0° | 180° | 2 6 |
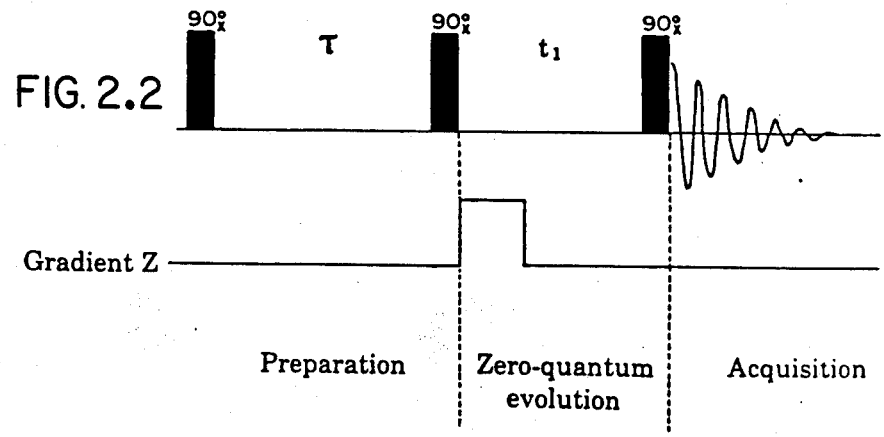
FIG. 2.2
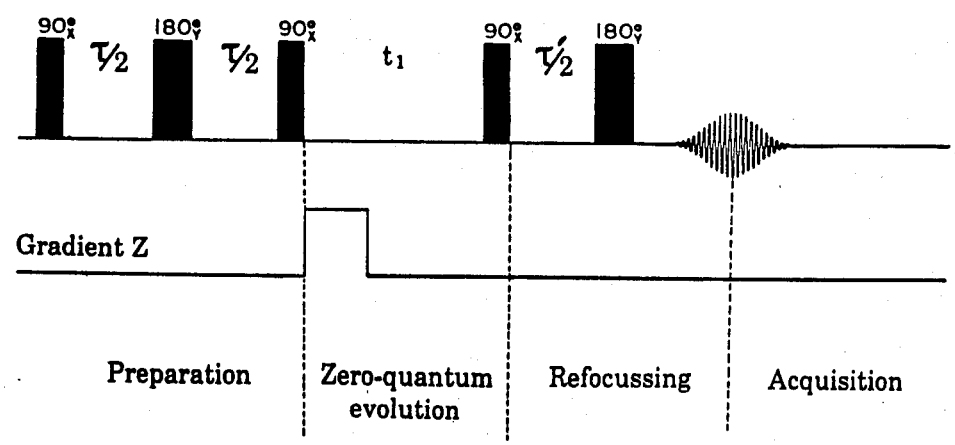
FIG. 2.3

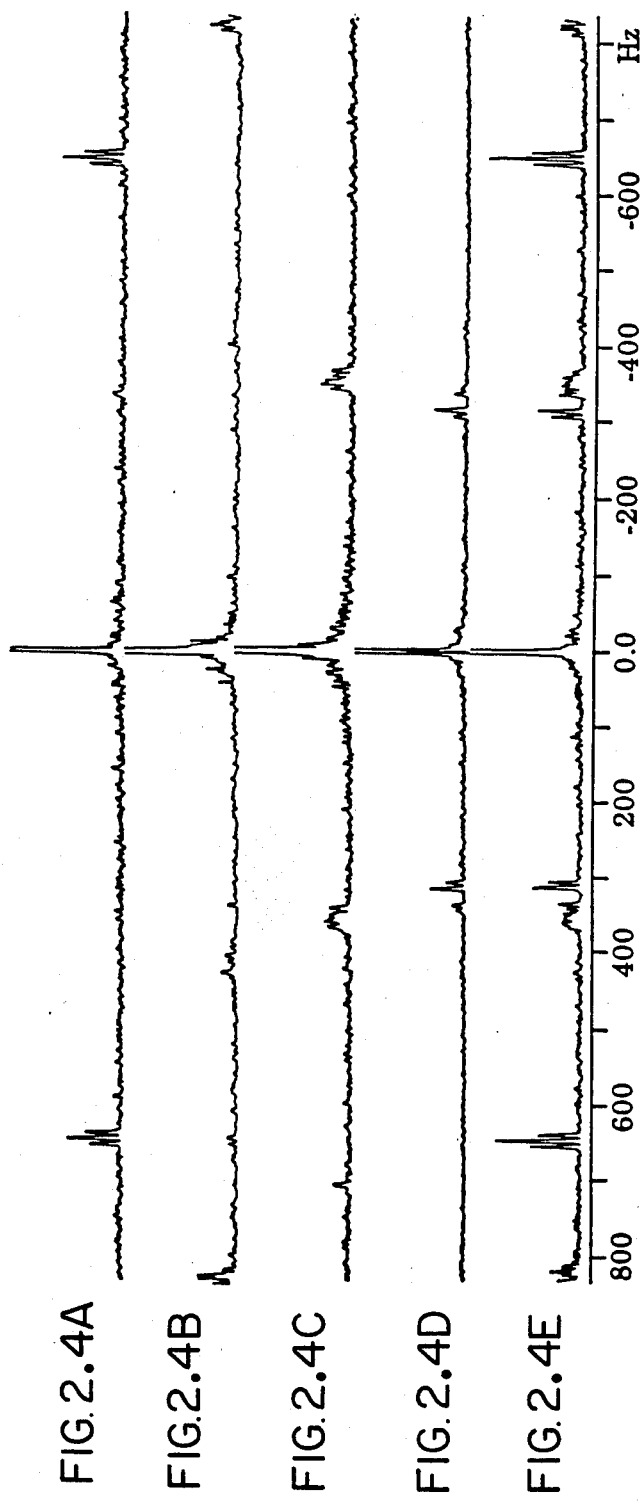

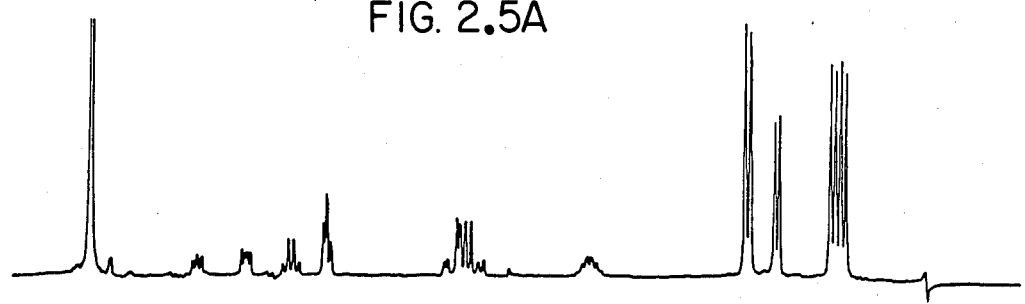
FIG. 2.5A
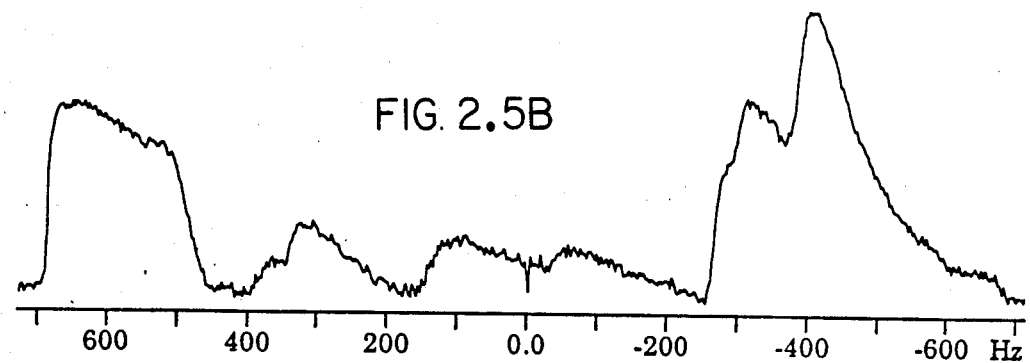
FIG. 2.5B
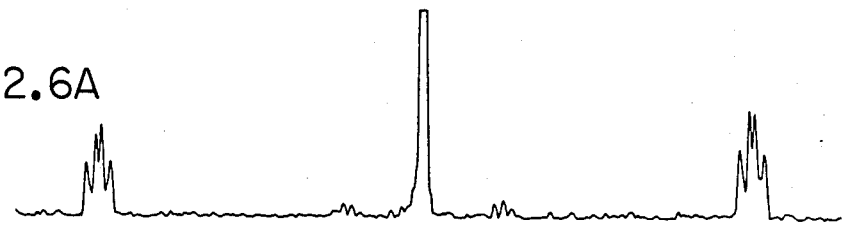
FIG. 2.6A
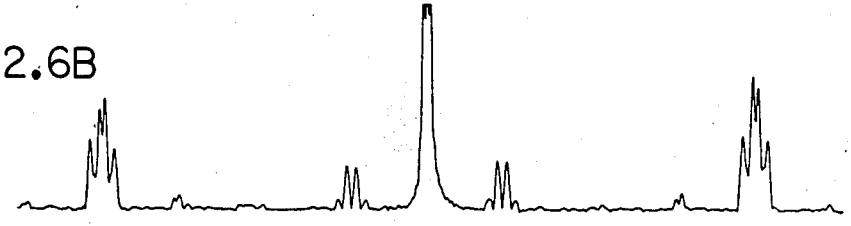
FIG. 2.6B
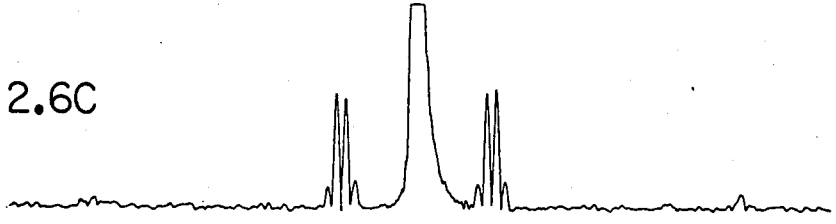
FIG. 2.6C
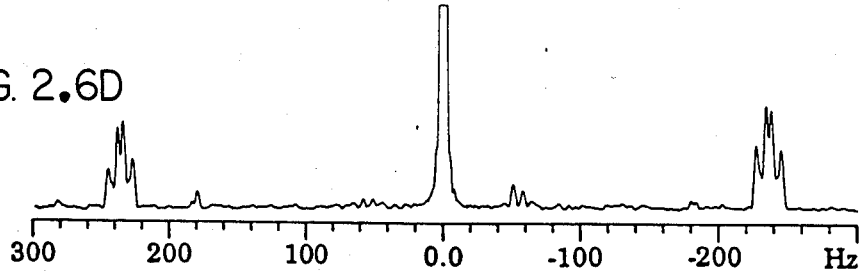
FIG. 2.6D

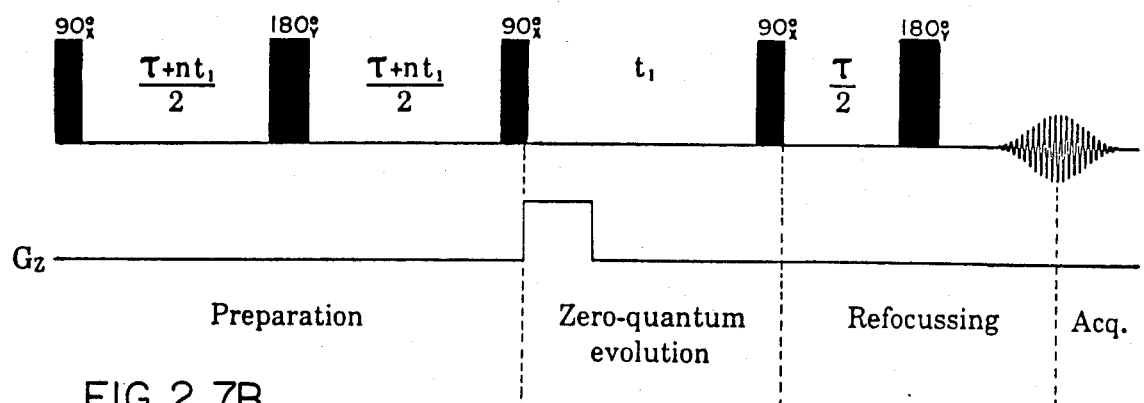
FIG. 2.7A
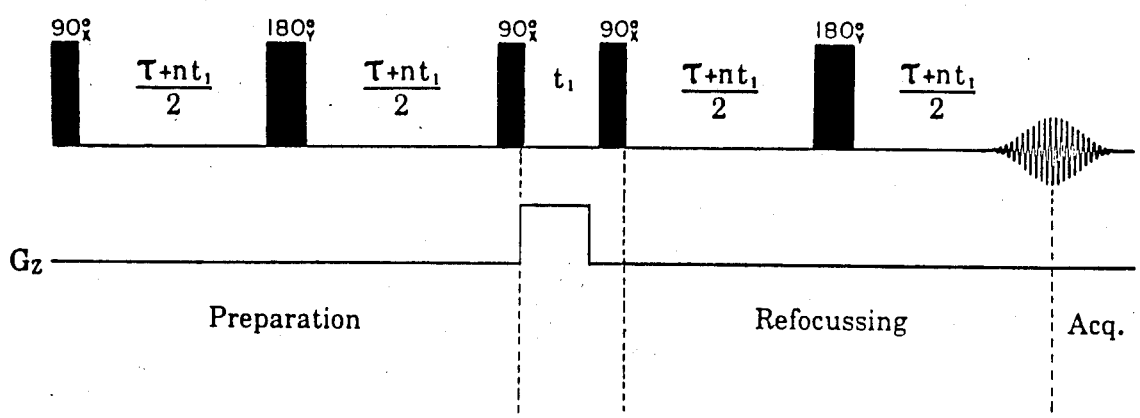
FIG. 2.7B
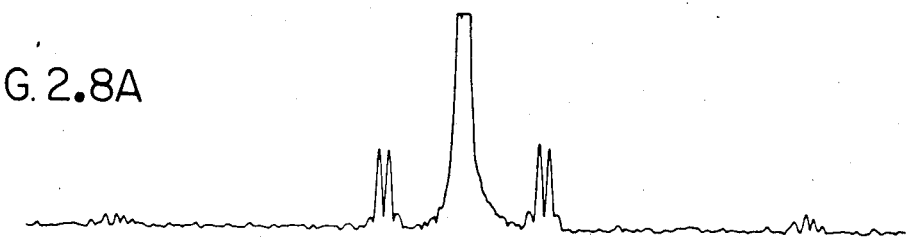
FIG. 2.8A
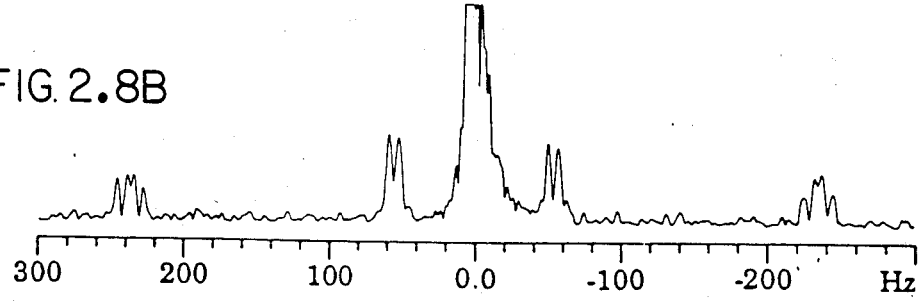
FIG. 2.8B FIG. 2.9
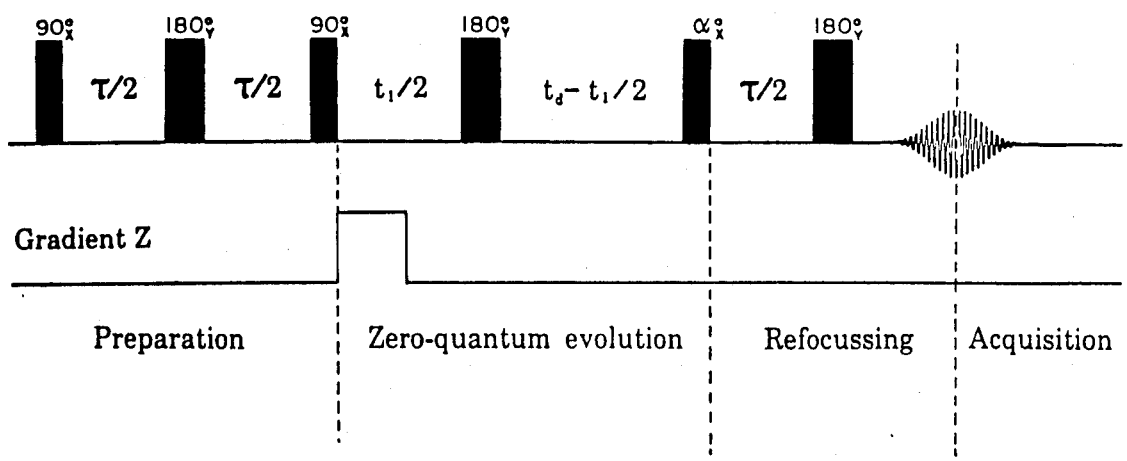
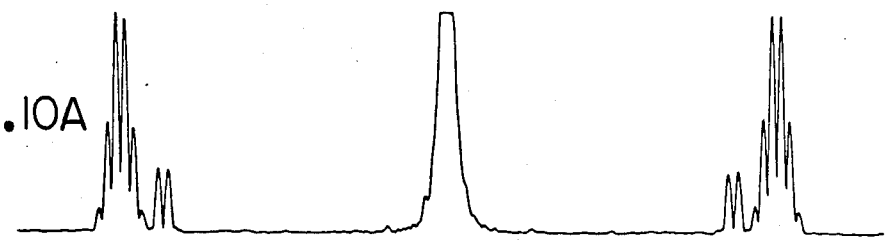
FIG. 2.10A
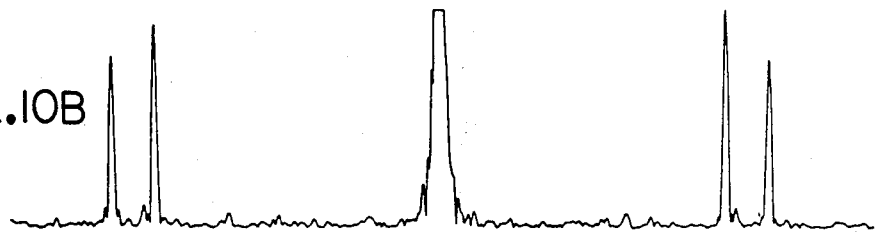
FIG. 2.10B
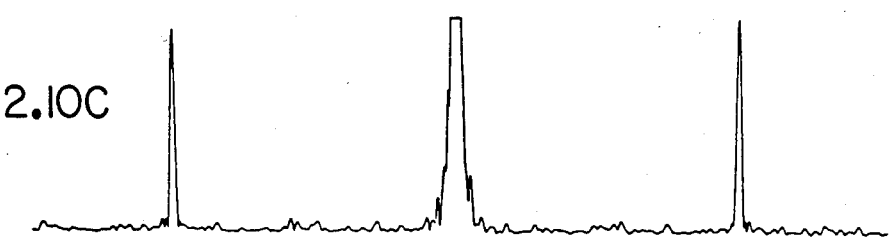
FIG. 2.10C
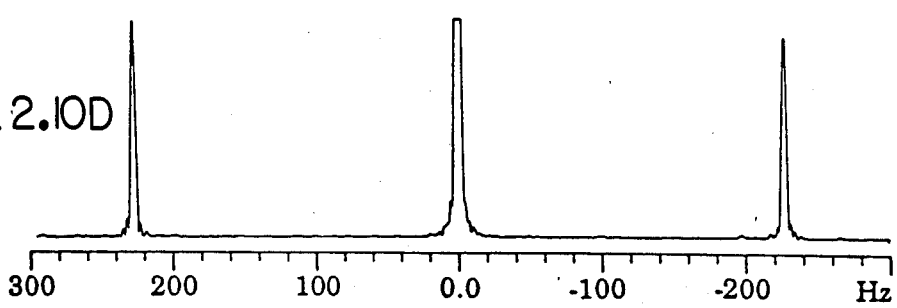
FIG. 2.10D

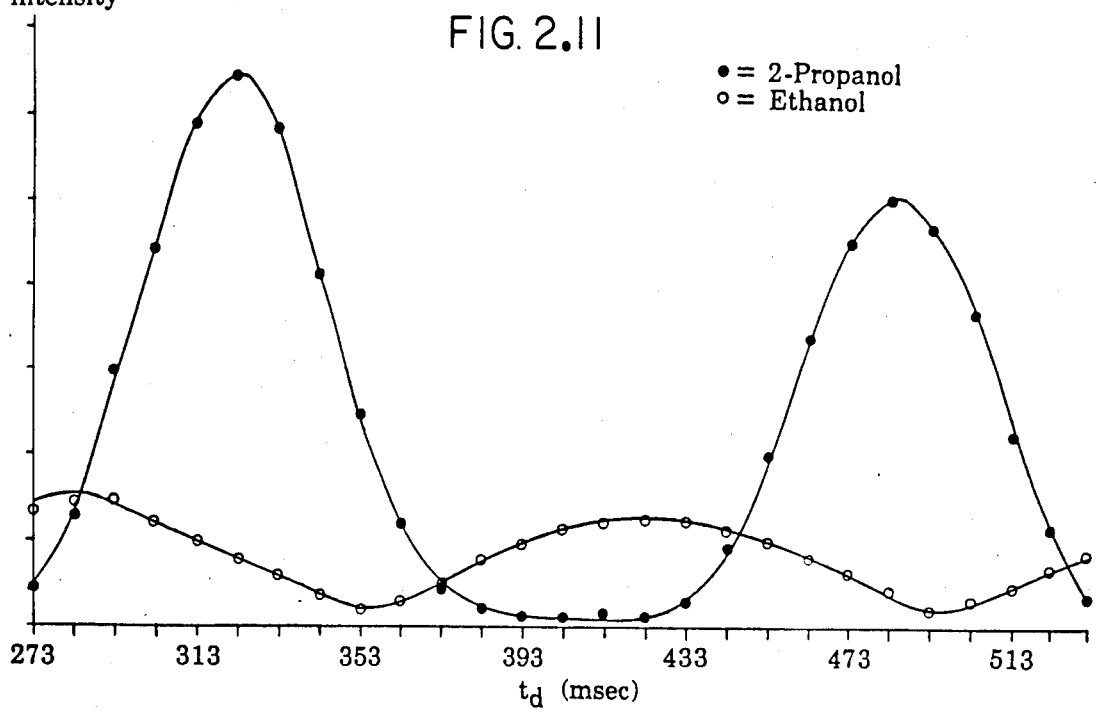
FIG. 2.11
● = 2-Propanol
○ = Ethanol
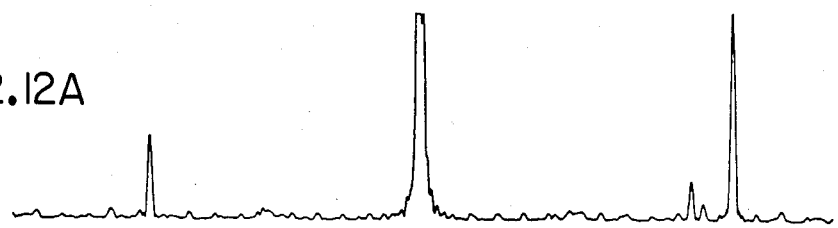
FIG. 2.12A
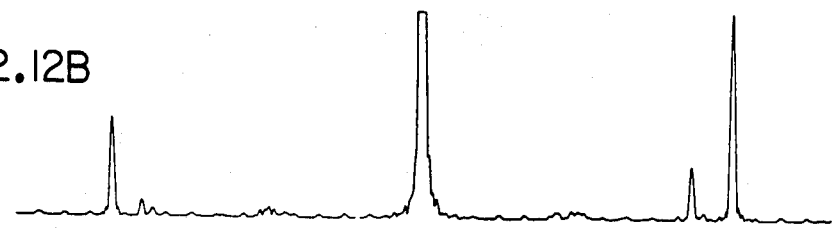
FIG. 2.12B
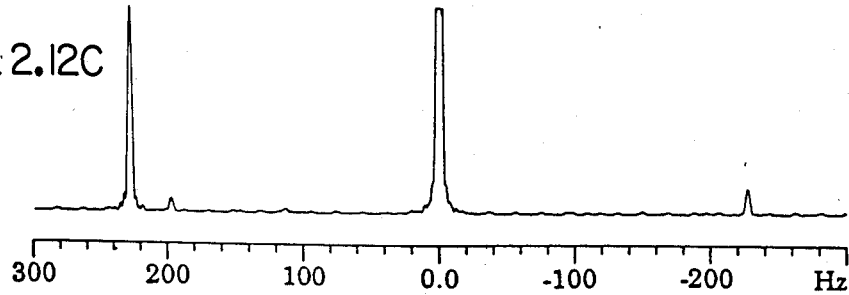
FIG. 2.12C

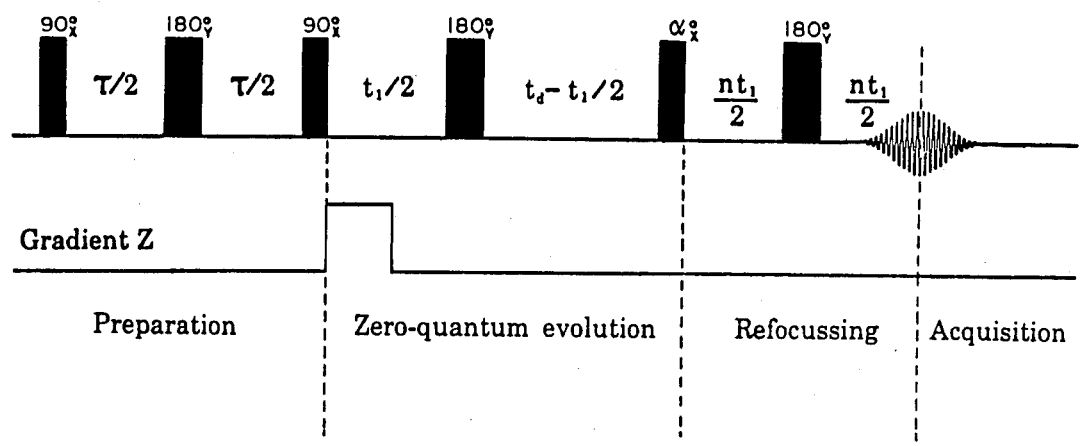
FIG. 2.13
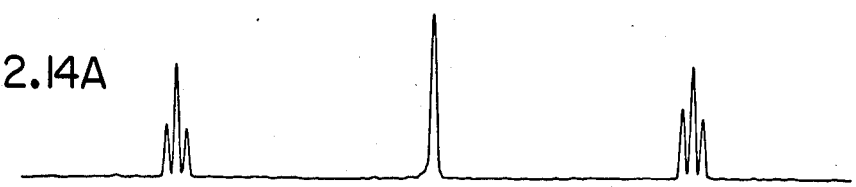
FIG. 2.14A
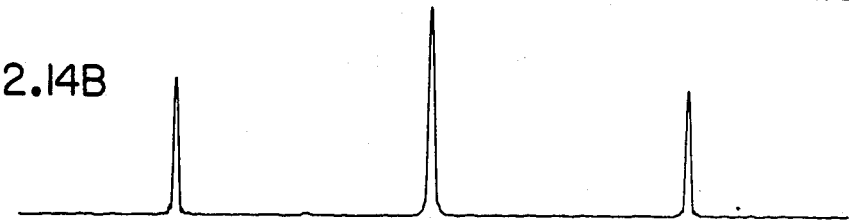
FIG. 2.14B
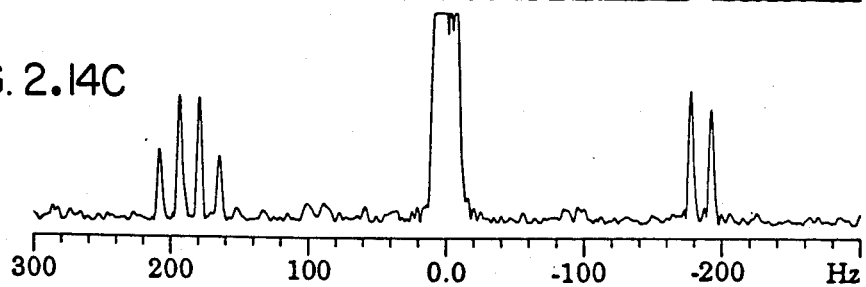
FIG. 2.14C
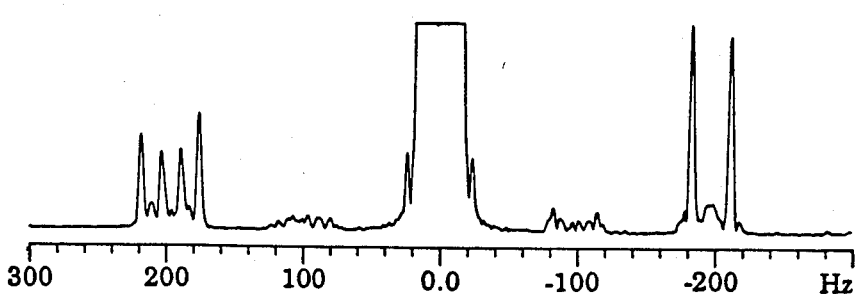
FIG. 2.15

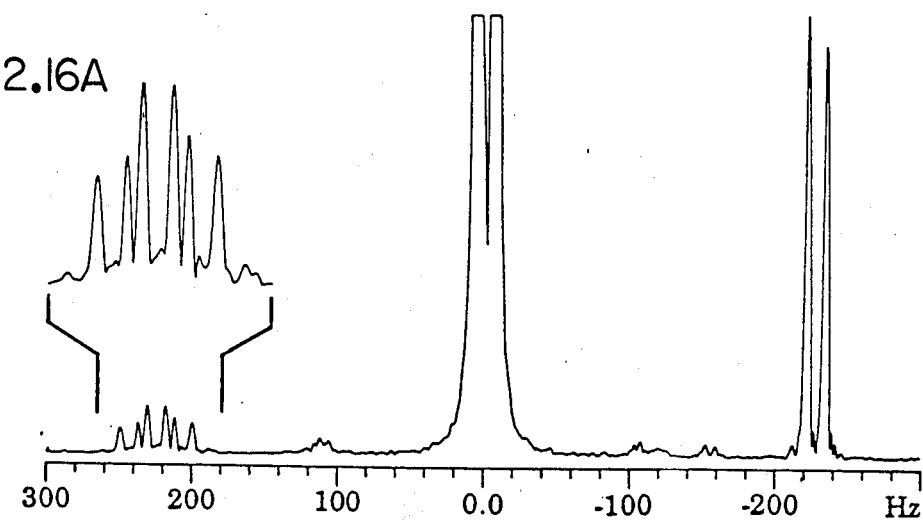
FIG. 2.16A
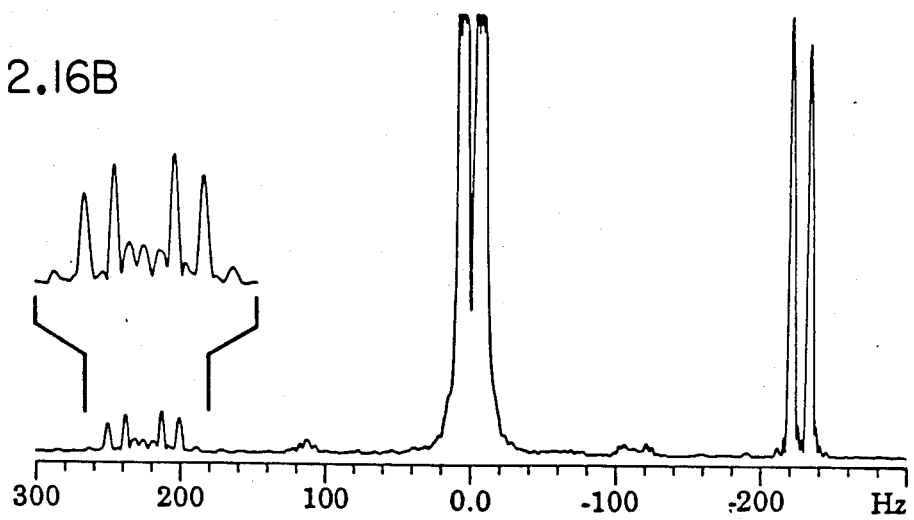
FIG. 2.16B

FIG. 2.17A
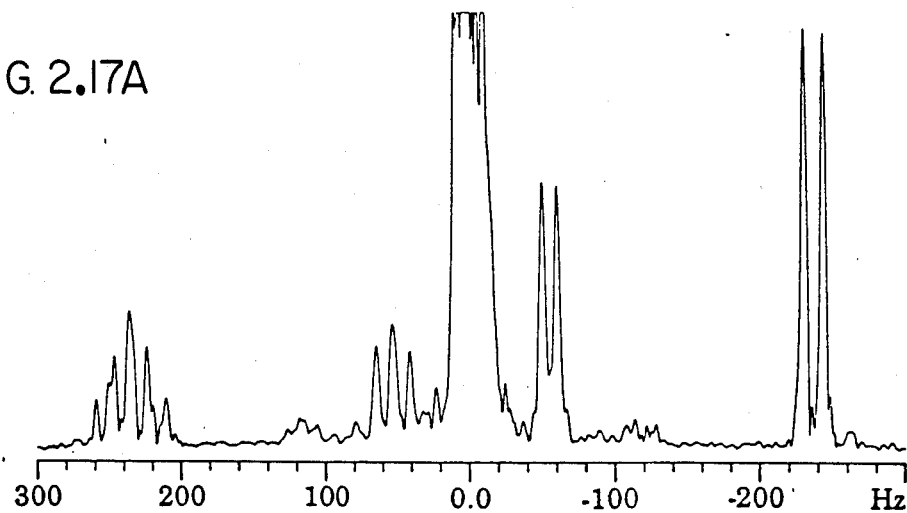
FIG. 2.17B
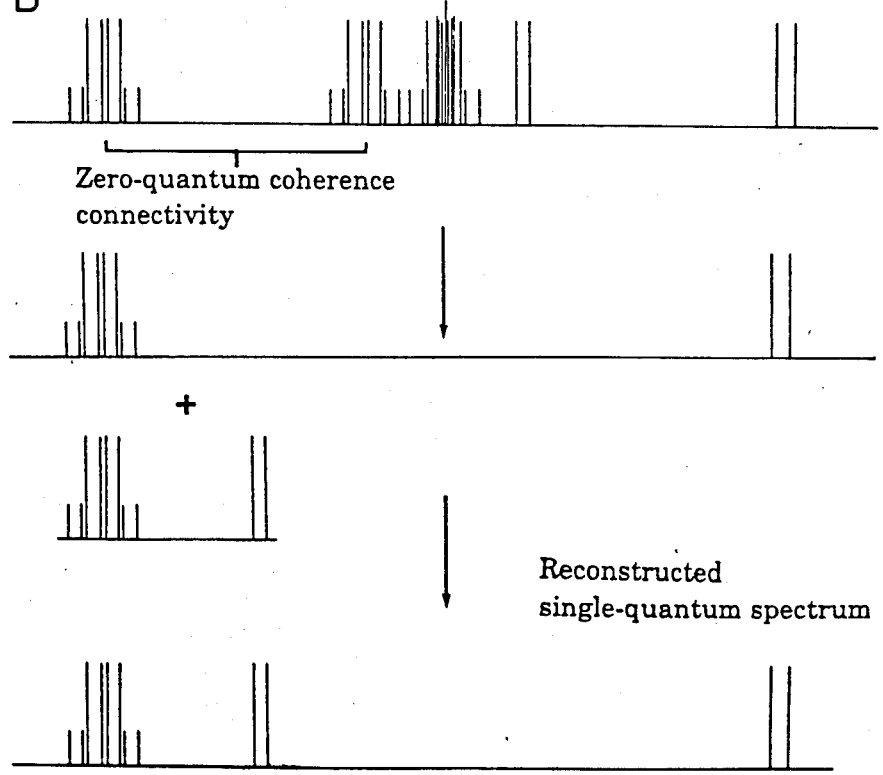
Zero-quantum coherence connectivity
Reconstructed single-quantum spectrum FIG. 2.17C
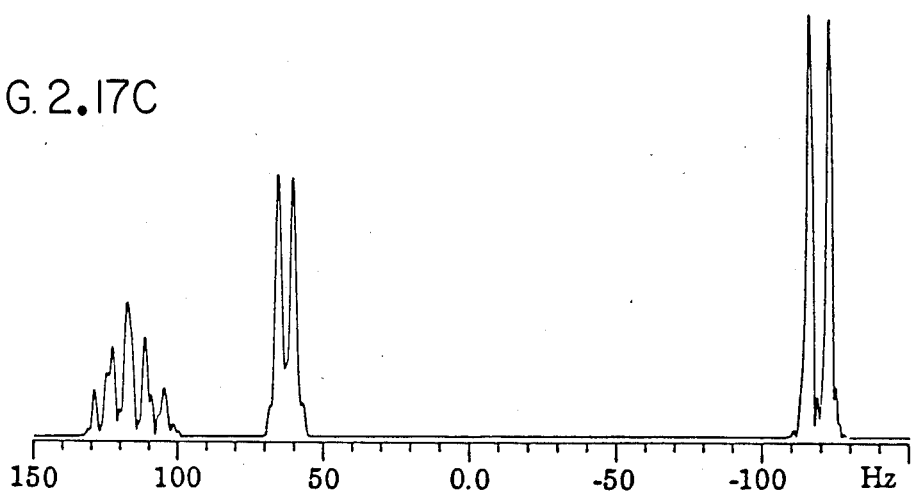
FIG. 2.17D
FIG. 2.18A
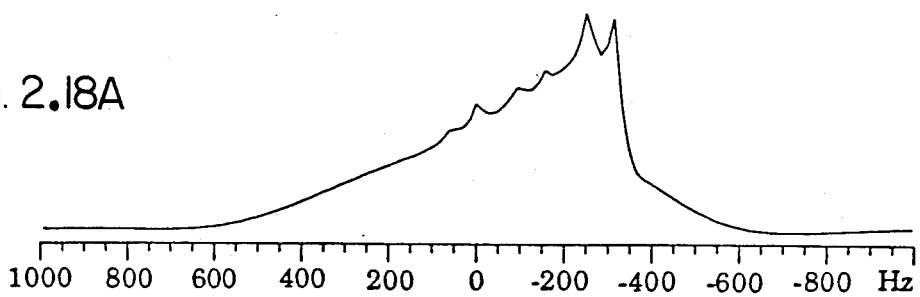
FIG. 2.18B
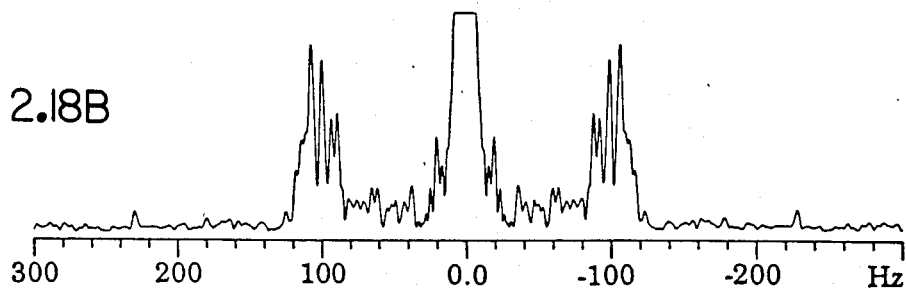
FIG. 2.18C
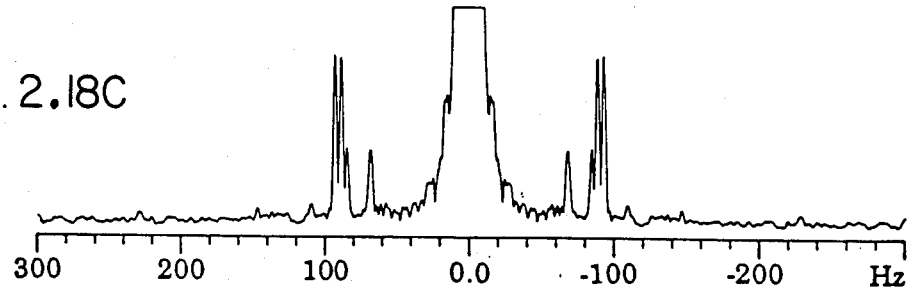

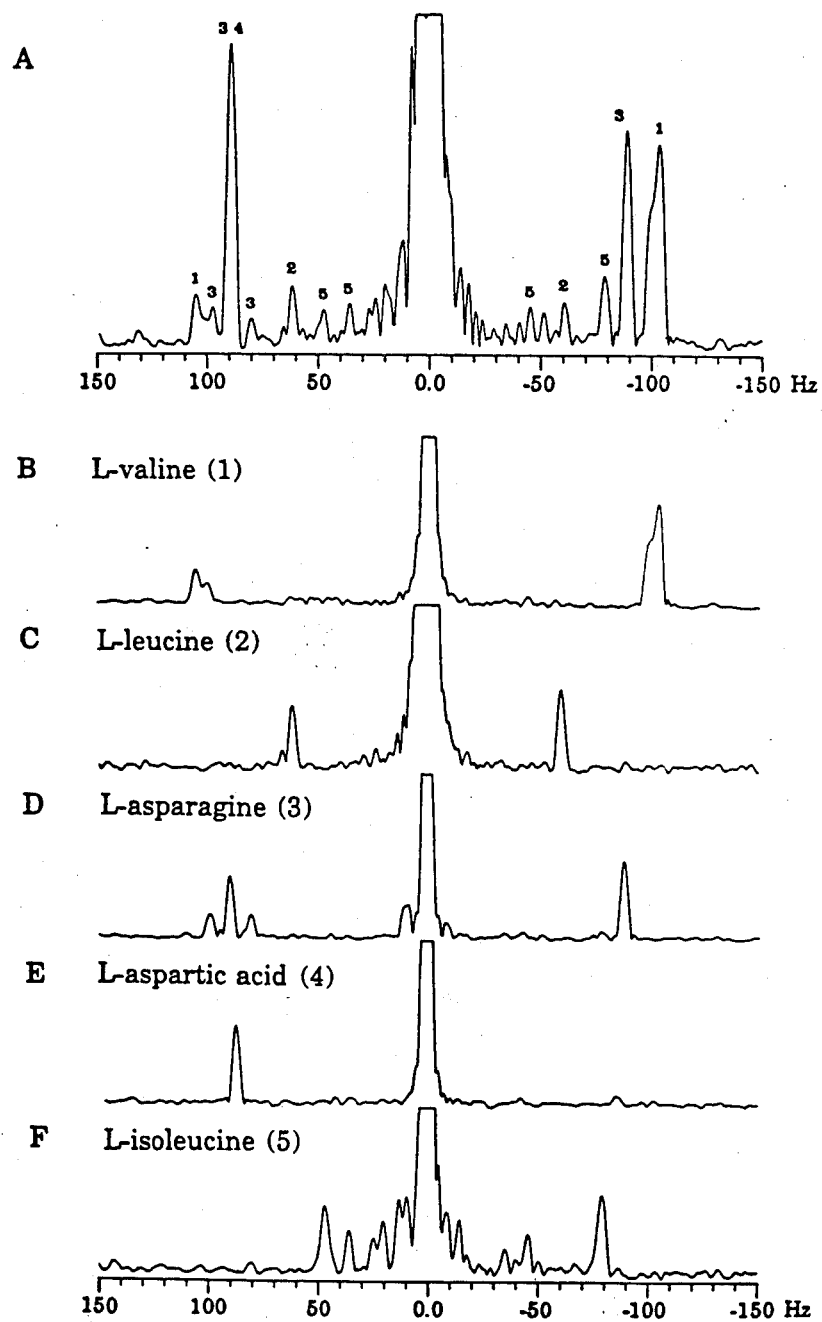

FIG. 3.1A
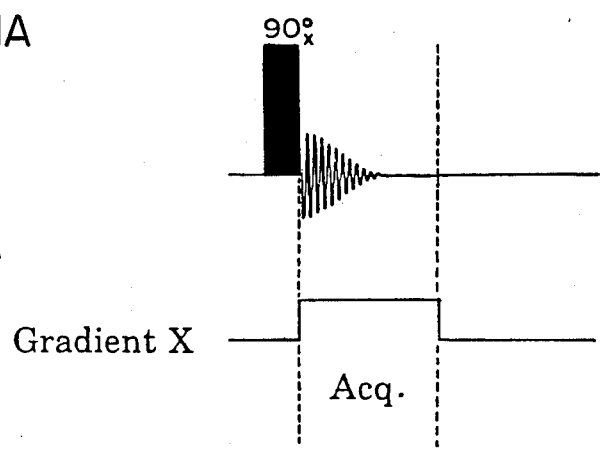
FIG. 3.1B
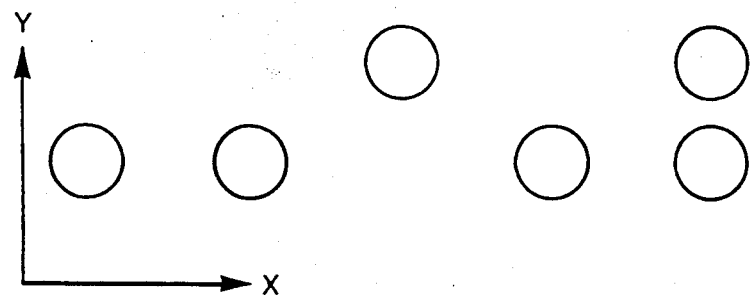
FIG. 3.1C
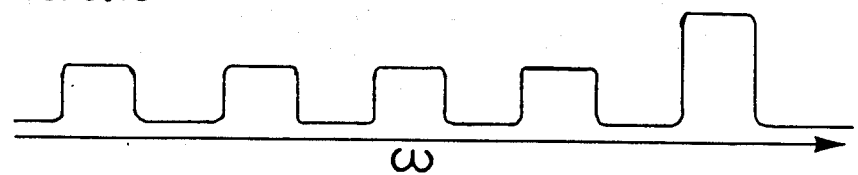
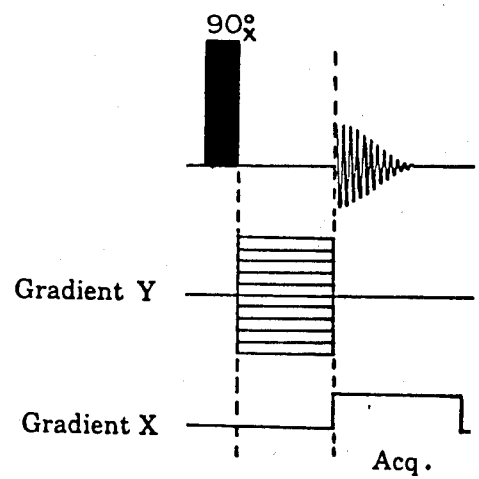
FIG. 3.2

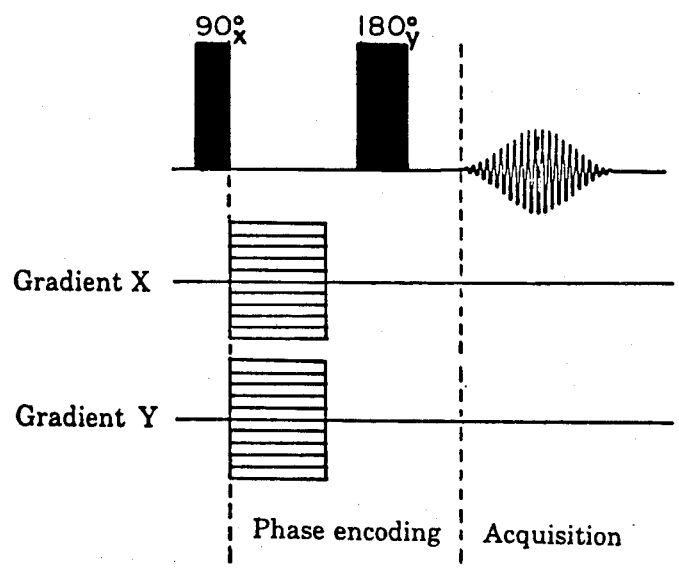
FIG. 3.3
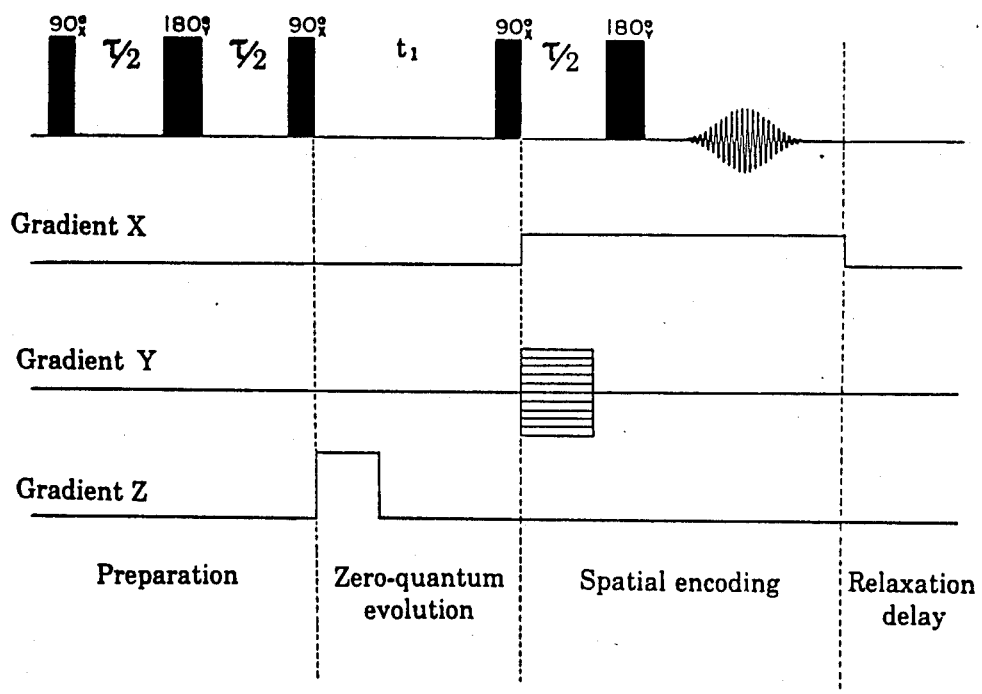
FIG. 3.4

FIG. 3.5A
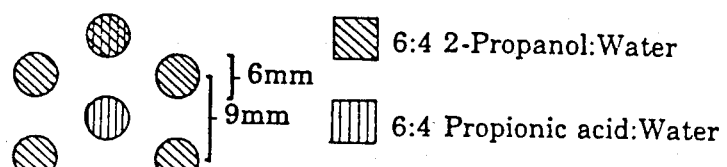
FIG. 3.5B
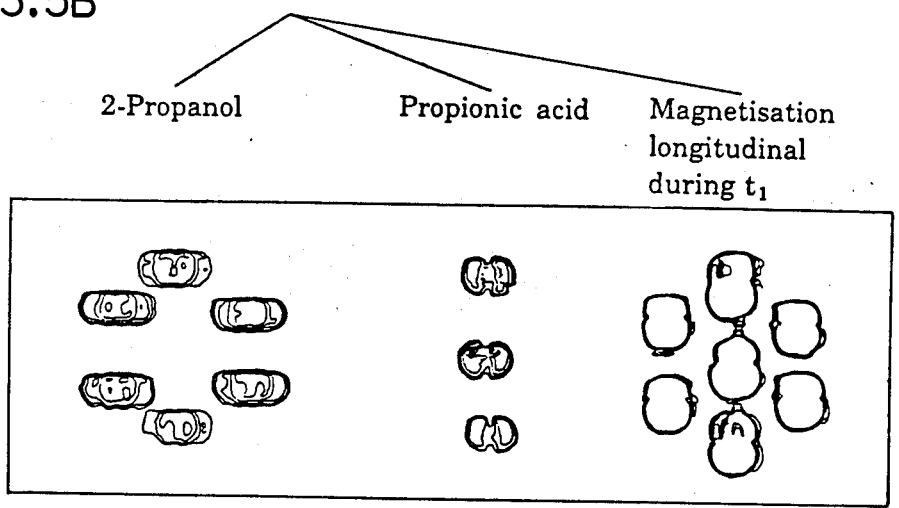
2-Propanol  Propionic acid  Magnetisation longitudinal during $t_1$
FIG. 3.5C
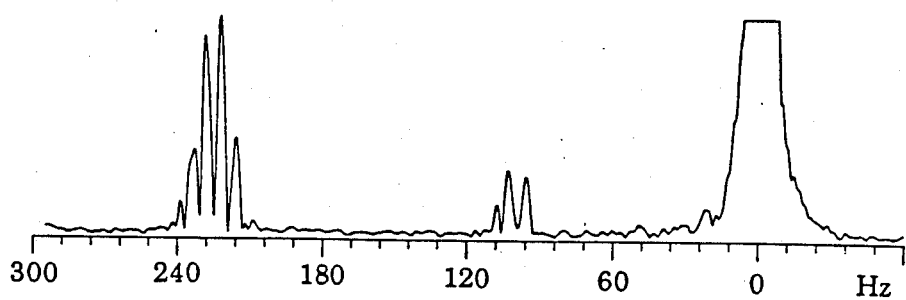

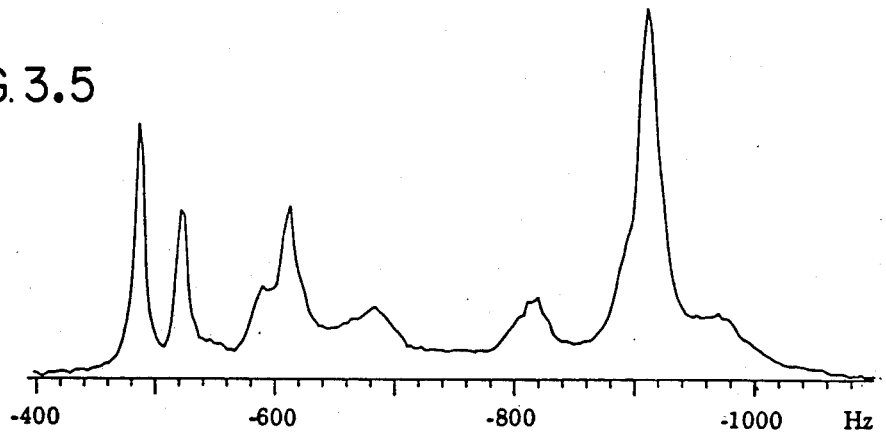
FIG. 3.5
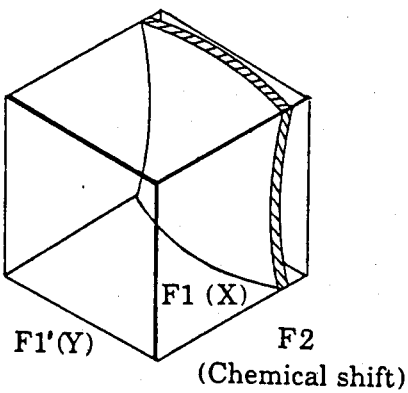
FIG. 3.6A
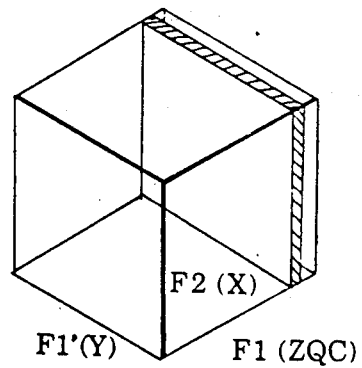
FIG. 3.6B

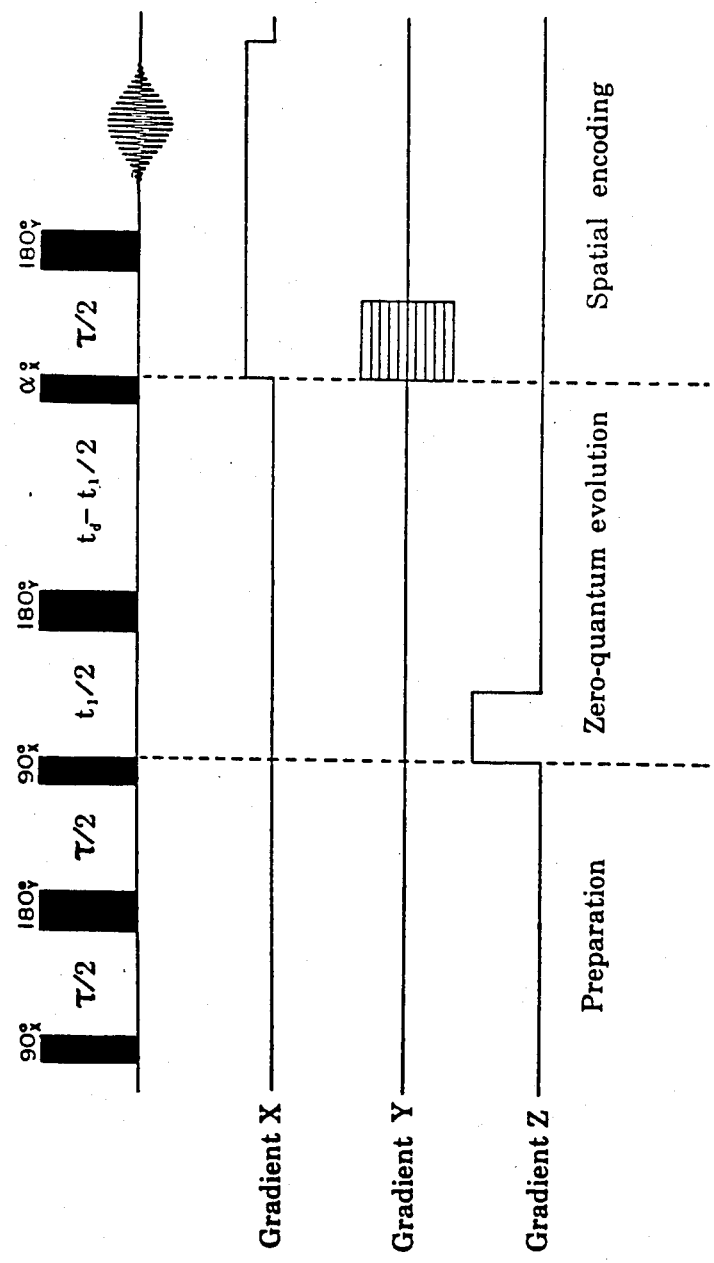
FIG.3.7

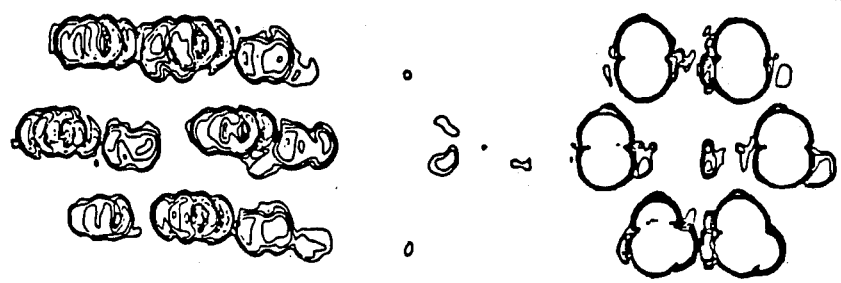
FIG. 3.8A
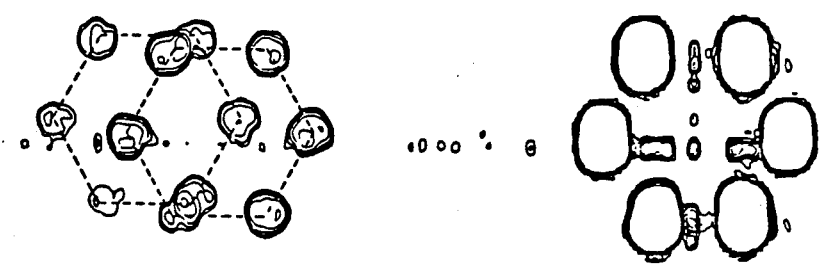
FIG. 3.8B
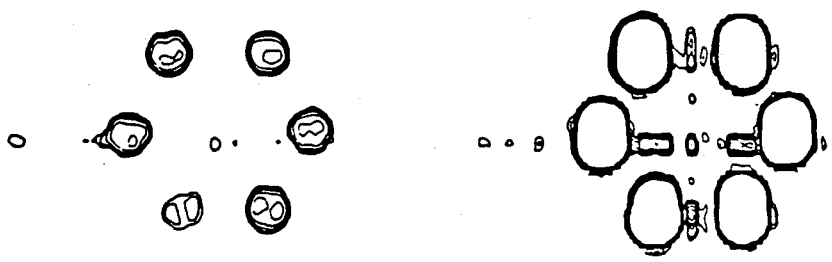
FIG. 3.8C
FIG. 3.8D
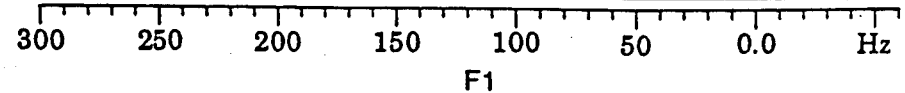

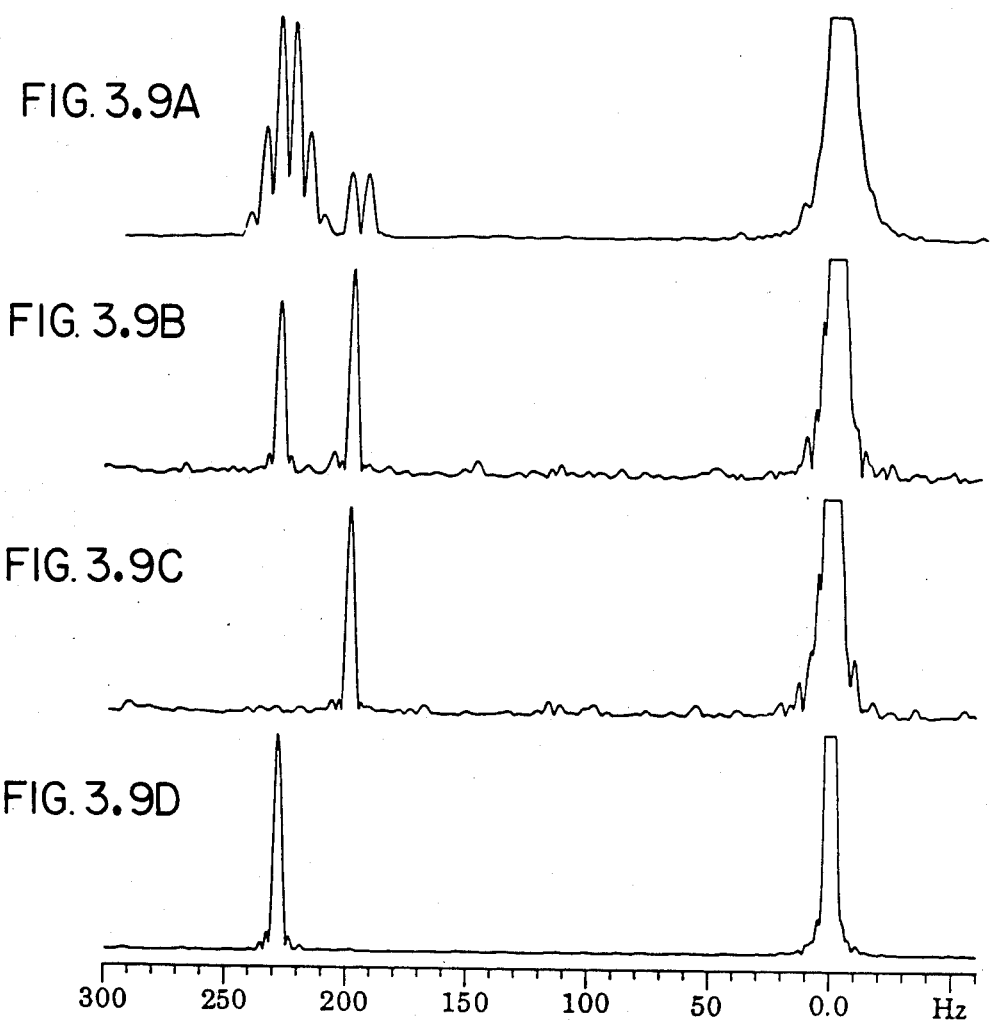
FIG. 3.9A
FIG. 3.9B
FIG. 3.9C
FIG. 3.9D
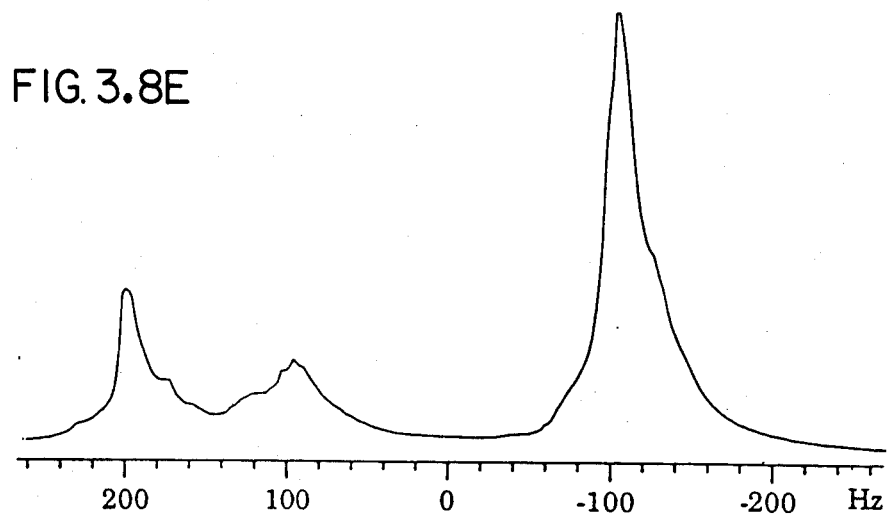
FIG. 3.8E

FIG. 3.10A
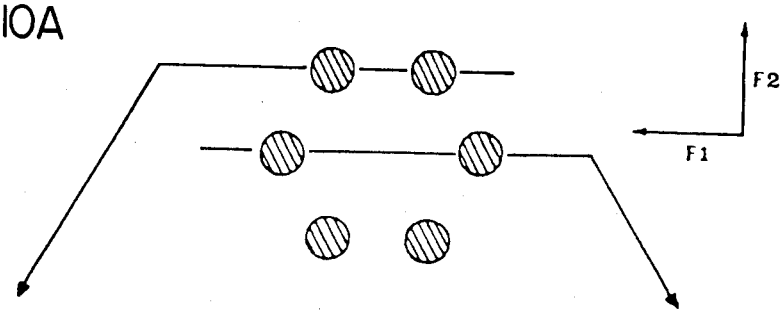
FIG. 3.10B
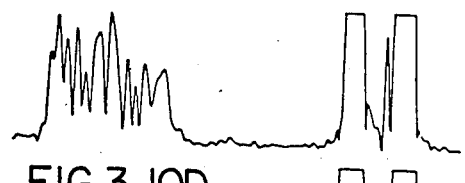
FIG. 3.10C
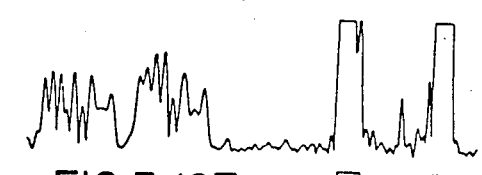
FIG. 3.10D
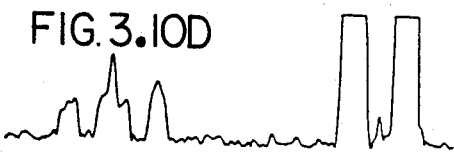
FIG. 3.10E
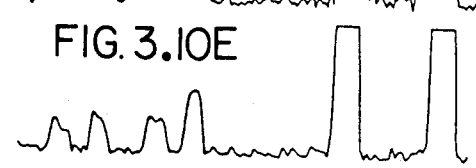
FIG. 3.10F
FIG. 3.10G
FIG. 3.10H
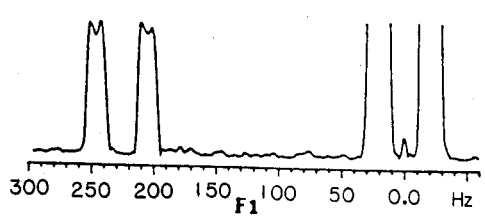
FIG. 3.10I
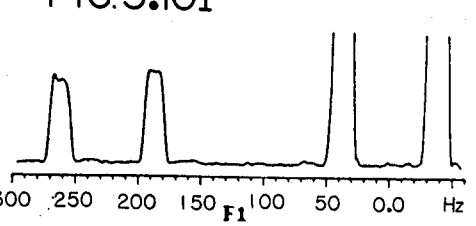

FIG. 3.11A
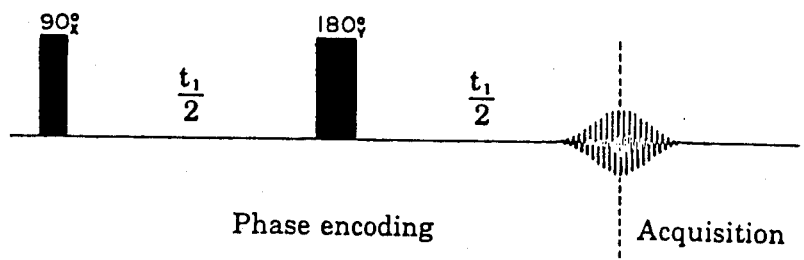
FIG. 3.11B
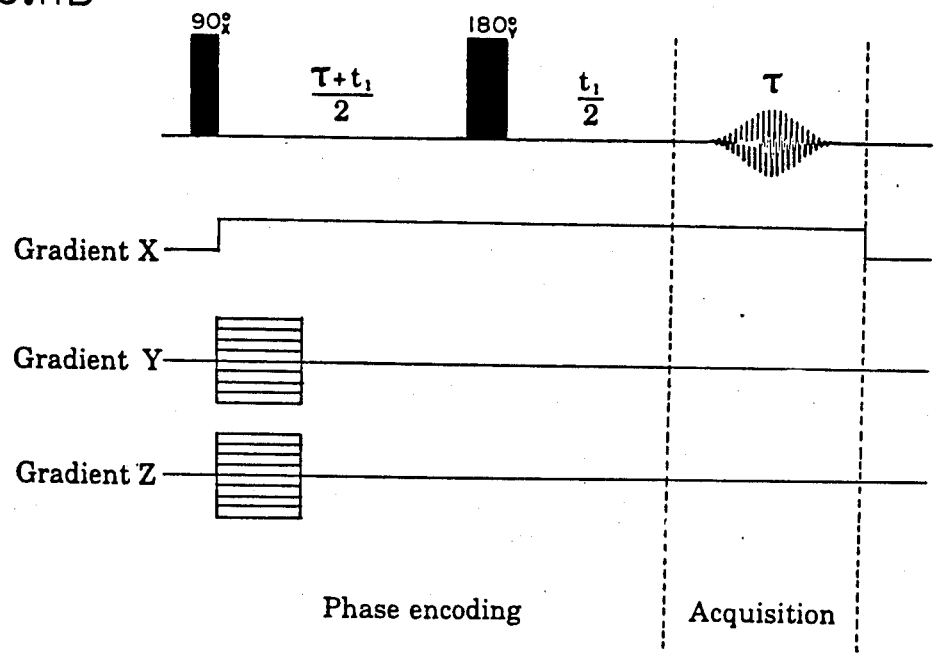

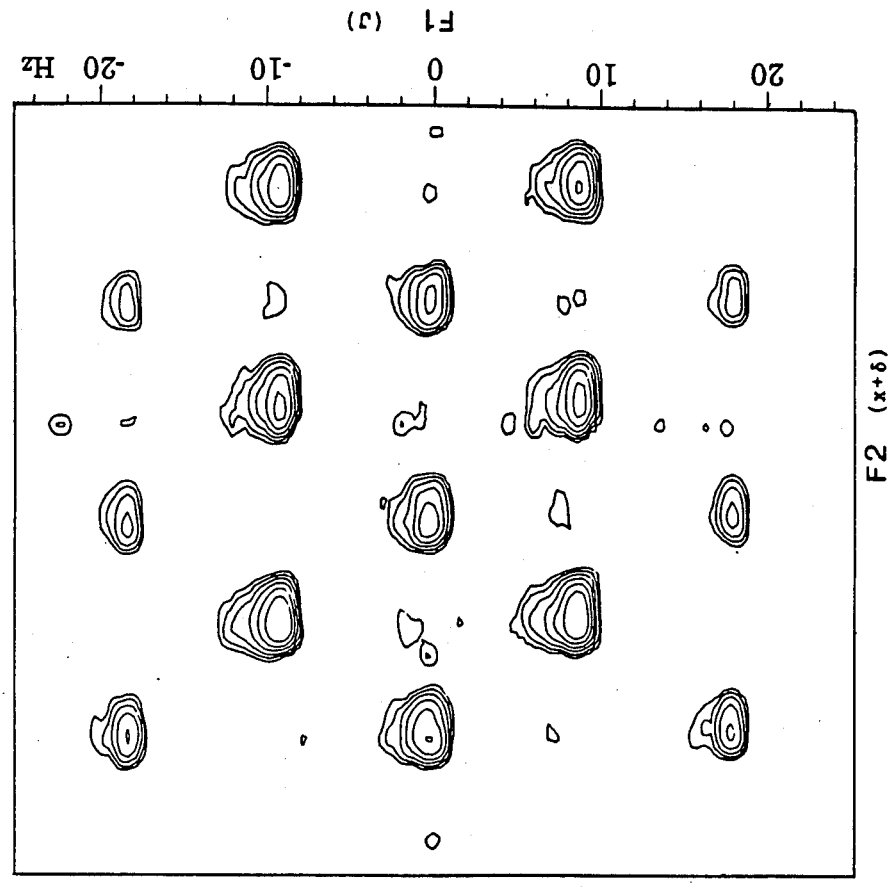
FIG. 3.13
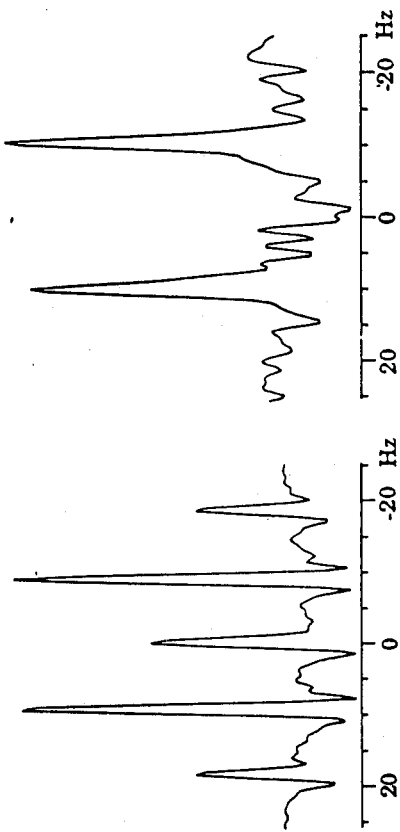
FIG. 3.12A
FIG. 3.12B
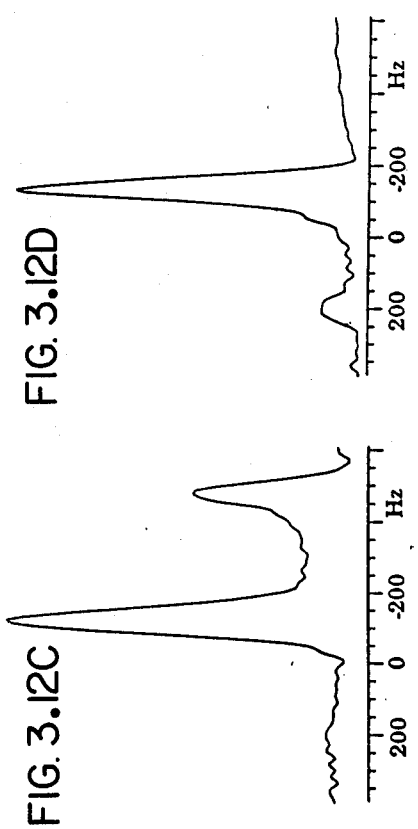
FIG. 3.12C
FIG. 3.12D

ZERO QUANTUM NMR IMAGING AND SPECTROSCOPY IN A LOW HOMOGENEITY MAGNETIC FIELD

FIELD OF THE INVENTION

This invention relates to zero-quantum nuclear magnetic resonance imaging and spectroscopy in an inhomogenous or low homogeneity magnetic field.

BACKGROUND OF THE INVENTION

Nuclear magnetic resonance (NMR) imaging and spectroscopy have been clearly established as important analytical procedures. Attention is being directed to the possible use of chemical shift resolved (C.S.R.) imaging to provide "maps" which show the spatial distribution of individual chemical species within an object. Such measurements generally require the homogeneity of the magnetic field to exceed 1 part in $10^7$ over the region of interest. This stems from the fact that the line widths of the single quantum (SQ) coherence are directly proportional to the overall field homogeneity.

Magnetic field inhomogeneity imposes limitations upon NMR spectroscopy and imaging in two specific areas: high resolution spectroscopy in isotropic liquids, and chemical shift resolved NMR imaging in isotropic liquids. In both cases, magnetic field inhomogeneity may degrade the resolution of spectra to such an extent that no useful information can be obtained from them. In high resolution NMR spectroscopy it is necessary to be able to extract accurately the parameters present within the spectrum such as chemical shifts, coupling constants and peak areas. In chemical shift resolved imaging experiments the requirements are less stringent; and it is only necessary that the resonances of different chemical species be resolved. However, even the less stringent requirements of NMR imaging are often difficult to meet as the sample volumes required are often several orders of magnitude larger than those required in conventional high resolution NMR spectroscopy.

Present NMR methods make use of single quantum, NMR coherences, which have the intrinsic property that their line-widths are directly proportional to the field-inhomogeneity. As a result, they require magnets with homogeneity of 1 part in $10^5$ for NMR imaging, 1 part in $10^7$ for chemical shift resolutions, and 1 part in $10^8$ for coupling constant measurements. All such magnets are expensive. For a field-inhomogeneity of only about 1 part in $10^3$, conventional NMR methods would produce only a single broad resonance with absolutely no information content whatsoever.

Single-quantum (SQ) NMR involves processes in which a single quantum transition of a single proton is involved; for example, the proton of $CHCl_3$ can undergo such a transition. In contrast, zero quantum (ZQ) NMR effectively involves no net change in the spin state of a set of two-protons. Thus $CHCl_3$ cannot give a ZQ response whereas CHCl=CCHBr can. In effect, each upward transition of one proton, is cancelled by a downward transition for the second.

SUMMARY OF THE INVENTION

This is a new process whereby NMR data can be obtained which have a frequency resolution of 1 part in $10^8$, using a magnetic field which only has a homogeneity of 1 part in $10^3$. This new method will:

(a) Provide zero quantum spectra with resolution of chemical shifts and coupling constants.

(b) Provide zero quantum spectra in which only chemical shifts are displayed and all coupling constants are suppressed.

(c) Provide zero quantum spectra in which the resonances of specific substances are suppressed and others enhanced (this is referred to as spectral editing).

(d) Provide zero quantum spectra which shows zero quantum chemical shifts but single quantum coupling constants.

(e) Provide by a process of reconstruction, a complete single quantum spectrum which displays all single quantum chemical shifts and single quantum coupling constants.

(f) Provide chemical shift resolved images which include all the advantages alluded to above in (a)-(e) above.

For this zero-quantum method, a field-homogeneity of 1 in $10^3$ is sufficient for any of the above described types of measurement. Magnets required for the method are less expensive than for simple quantum measurement. More importantly, it may be possible to build a magnet capable of 1 part in $10^3$ homogeneity, the geometry of which would be impossible to yield 1 part in $10^8$ homogeneity.

These new zero-quantum NMR measurements can conceivably be used for such widely disparate fields as medical imaging/spectroscopy, or evaluation of oil-reservoirs. The method will also make possible NMR measurements using magnets which cannot produce high enough homogeneity for any single quantum measurements.

A method of obtaining zero-quantum coherence resolved images and spectra from a spin system substance in an inhomogeneous or low homogeneity magnetic field which comprises applying a pulse and spatial encoding sequence to the substance.

The method includes four stages:

(a) during a substance preparation phase, applying a pulse field-gradient which destroys all multiple-quantum coherences, leaving only zero-quantum coherences;

(b) allowing the zero-quantum coherences to evolve for a period of time sufficient to enable them to obtain information from their surrounding environment;

(c) applying an appropriate pulse to communicate the information to a single quantum space; and (d) applying spatial encoding to the information to provide a map reflecting the spatial distribution of the original spins of the substance.

DRAWINGS

In the drawings:

FIG. 2.1. Basic zero-quantum experiment.

FIG. 2.2. Basic zero-quantium experiment with magnetic field gradient order selection.

FIG. 2.3. Refocused zero-quantum experiment with magnetic field gradient order selection. The 180° pulses in the preparation and refocusing periods are essential in an inhomogeneous magnetic field to reverse dephasing due to magnetic field inhomogeneities.

FIG. 2.4. Zero-quantum spectra obtained at 270 MHz with the refocused zero-quantum experiment. In a homogeneous magnetic field: A. L-alanine, B. L-threonine, C. L-valine, D. L-asparagine. In an inhomogeneous magnetic field: E. A mixture of the above. All concentrations were 0.1 molar in $D_2O$; $\tau$, $\tau'=60$ msec, $\Delta t_1 = 600$ μsec, total acquisition time was 15 minutes in each case.

FIG. 2.5. Single quantum spectra at 270 MHz of a solution in $D_2O$ of L-alanine, L-threonine, L-valine and L-asparagine, all concentrations 0.1 molar. A. In a homogeneous magnetic field, B. In a inhomogeneous magnetic field corresponding to FIG. 2.4 E.

FIG. 2.6. Zero-quantum spectra obtained at 80 MHz in an inhomogeneous magnetic field with the refocused zero-quantum experiment of 0.1 molar L-threonine in $D_2O$ with: A. $\tau,\tau'=60$ msec, B. $\tau,\tau'=100$ msec, C. $\tau,\tau'=140$ msec, D. $\tau=100$ msec, $\tau'=60$ msec. In each case $\Delta t_1 = 1.67$ msec, 256 blocks were collected with 4 acquisitions per block. Acquisition times 15–16 minutes.

FIG. 2.7. Refocussed zero-quantum experiment with A. an accordion preparation period, and B. with accordion preparation and refocussing periods.

FIG. 2.8. Zero-quantum spectra at 80 MHz of 0.1 molar L-threonine in $D_2O$ with: A. The refocused zero-quantum experiment with an "accordion" preparation period (FIG. 2.7A), B. The refocused zero-quantum experiment with "accordion" preparation and refocusing periods. In both cases $\tau=70$ msec, $\Delta t_1 = 1.67$ msec, $n=0.12$. 256 blocks collected, 8 acquisitions per block. Acquisition times 35–37 minutes.

FIG. 2.9. Broad-band decoupled zero-quantum experiment.

FIG. 2.10. Zero-quantum spectra of ethanol and 2-propanol, 1:1 in $D_2O$. A. Conventional zero-quantum spectra obtained with the refocused zero-quantum experiment; $\tau,\tau'=60$ msec, $\Delta t_1 = 1.67$ msec. 256 blocks collected, 4 acquisitions per block. B–D. Broad band decoupled zero-quantum spectra: B. $t_d=443$ msec, C. $t_d=413$ msec, D $t_d=493$ msec. In B–D $\tau=60$ msec, $\Delta t_1 = 1.67$ msec, $\alpha=90°$. 256 blocks collected, 4 acquisitions per block. Peak assignments: ethanol ±197 Hz, 2-propanol ±225 Hz.

FIG. 2.11. Graph of peak intensity vs. $t_d$ for the broad band decoupled zero-quantum experiment for a 1:1 solution of ethanol and 2-propanol in $D_2O$.

FIG. 2.12. Broad band decoupled zero-quantum spectra of a 1:1 solution of ethanol and 2-propanol in $D_2O$ with $\alpha=45°$ : A. $t_d=413$ msec, B $t_d=443$ msec, C. $t_d=493$ msec. $\tau=60$ msec, $\Delta t_1 = 1.67$ msec, 256 blocks collected, 4 acquisitions per block. Peak assignments: ethanol ±197 Hz, 2-propanol ±225 Hz.

FIG. 2.13. Single-quantum J-resolved broad-band decoupled zero-quantum experiment.

FIG. 2.14. Spectra of 0.1 molar L-alanine in $D_2O$. A. Conventional zero-quantum spectrum obtained with the refocused zero-quantum experiment. $\tau,\tau'=60$ msec, $\Delta t_1 = 1.67$ msec. 256 blocks collected, 4 acquisitions per block. B. Broad band decoupled zero-quantum spectrum. $\tau=60$ msec, $t_d=443$ msec, $\Delta t_1 = 1.67$ msec. 256 blocks collected, 4 acquisitions per block. C. Single-quantum J-resolved broad band decoupled zero-quantum spectrum. $\alpha=22.5°$, $\tau=60$ msec, $t_d=443$ msec, $\Delta t_1 = 1.67$ msec, $n=2$. 256 blocks collected, 8 acquisitions per block.

FIG. 2.15. Single-quantum J-resolved broad band decoupled zero-quantum spectrum of ethanol in $D_2O$ (2:1). $\alpha=45°$, $\tau=60$ msec, $t_d=413$ msec, $\Delta t_1 = 1.67$ msec, $n=2$. 256 blocks collected, 8 acquisitions per block.

FIG. 2.16. Single-quantum J-resolved broad band decoupled zero-quantum spectra of 2-propanol in $D_2O$ (3:1). A. $\alpha=45°$. B. $\alpha=22.5°$. In both cases $\tau=60$ msec, $t_d=493$ msec, $\Delta t_1 = 1.67$ msec, $n=2.256$ blocks collected, 8 acquisitions per block.

FIG. 2.17. Spectra of L-threonine, A. single-quantum J-resolved broad-ban decoupled spectrum, B. diagramatic representation of the metod of reconstruction of single-quantum spectra from thoses obtained in the single-quantum J-resolved broad-band decoupled zero-quantum experiment. C. Reconstructed single-quantum spectra of L-threonine from the spectrum in part A. D. Normal single-quantum spectrum of L-threonine.

FIG. 2.18. Spectra of a solution of L-valine, L-leucine, L-asparagine, L-aspartic acid and L-isoleucine in $D_2O$, quantum spectra obtained with the refocused zero-quantum experiment; B. . $\tau,\tau'=60$ mesc, C. $\tau,\tau'=140$ msec. For parts B and C $\Delta t_1 = 1.67$ msec, 256 blocks collected, 8 acquisitions per block.

FIG. 2.19. Broad-band decoupled zero-quantum spectra of: A. L-valine, L-leucine, L-asparagine, L-aspartic acid and L-isoleucine, B. L-valine, C. L-leucine, D. L-asparagine, E. L-aspartic acid, F. L-isoleucine.

FIG. 3.1. A. One-pulse experiment with a magnetic field gradient in the x-direction on during acquisition to frequency encode the x-coordinates of spins contributing to the FID. B. Representation jof a phantom consisting of vials of $H_2O$. C. Representation of the spectrum obtained when the pulse sequence in part A is used on the phantom in part B.

FIG. 3.2. Two-dimensional spin-density imaging experiment. The y-dimension is phased encoded prior to acquisition and the x-dimension is frequency encoded during acquisition.

FIG. 3.3. Chemical shift resolved imaging experiment. Two spatial dimensions, x and y, are phase encoded prior to acquisition, and the chemical shift spectrum is acquired directly.

FIG. 3.4. Zero-quantum coherence resolved imaging experiment.

FIG. 3.5. A. The structure and composition of the phantom used. B. The two-dimensional zero-quantum coherence resolved image obtained with the phantom in part A, $t_1$ and $G_y$ were incremented simultaneously. $\tau=60$ msec, $\Delta t_1 = 1.67$ msec, $\Delta G_y = 1.84 \times 10^{-3}$ Gcm$^{-1}$ (application time = 10 msec), $G_x = 0.41$ Gcm$^{-1}$, 256 blocks collected, 16 acquisitions per block. Total acquisition time 75 minutes. C. Zero-quantum spectrum of the quantum obtained with the refocused zero-quantum experiment. $\tau=60$ msec, $\Delta t_1 = 1.67$ msec, 256 blocks collected, 8 acquisitions per block. Total acquisition time 35 minutes. D. Single-quantum spectrum of the phantom.

FIG. 3.6. A. Dataset for a chemical shift resolved imaging experiment. Slices taken through the F2 (chemical shift) dimension may have to be non-planar to compensate for a spatially inhomogeneous magnetic field. B. Dataset for a zero-quantum coherence resolved imaging experiment. Slices taken through the F1 (zero-quantum coherence) dimension are planar, independent to magnetic field inhomogeneity, and require no special manipulation.

FIG. 3.7. Broad-band decoupled zero-quantum coherence resolved imaging experiment.

FIG. 3.8. Images and spectra of a phantom consisting of 6 vials, diameter 6 mm, containing 2-propanol and ethanol, 1:1 in $D_2O$, arranged in a hexagon with sides of length 9 mm. A. Zero-quantum coherence resolved image of the phantom; $\tau=60$ msec, $\Delta t_1 = 1.67$ msec, $\Delta G_y = 1.5 \times 10^{-3}$ Gcm$^{-1}$ (applied for 10 msec), $G_x = 0.34$ Gcm$^{-1}$, 256 blocks collected, 16 acquisitions per block, B–D, broad band decoupled zero-quantum coherence resolved images of the phantom: B. $t_d = 443$ msec (both ethanol and 2-propanol present), C. $t_d = 413$ msec (2-propanol edited out), D. $t_d = 493$ msec (ethanol edited out). For B–D $\tau = 60$ msec, $\Delta t_1 = 1.67$ msec, $\Delta G_y = 5.55 \times 10^{-4}$ Gcm$^{-1}$ (applied for 27 msec), $G_x = 0.34$ Gcm$^{-1}$, 256 blocks collected, 4 acquisitions per block. E. Single-quantum spectrum of phantom. Assigments: $-100$ Hz, 100 Hz -overlapping peaks of both ethanol and 2-propanol, 200 Hz -HDO.

FIG. 3.9. Spectra corresonding to the images in FIG. 3.8 A-D of ethanol and 2-propanol, 1:1 in D$_2$O. A. Zero-quantum quantum spectrum obtained with the refocused zero-quantum experiment; $\tau = 60$ msec, $\Delta t_1 = 1.67$ msec, 256 blocks collected, 4 acquisitions per block. B–D. Broad band decoupled zero-quantum spectra: B. $t_d = 443$ msec (both ethanol and 2-propanol present), C. $t_d = 413$ msec (2-propanol edited out), D. $t_d = 493$ msec (ethanol edited out). For B–D $\tau = 60$ msec, $\Delta t_1 = 1.67$ msec, 256 blocks collected, 4 acquisitions per block. Peak assignments: ethanol $\pm 197$ Hz, 2-propanol $\pm 225$ Hz.

FIG. 3.10. A. Representation of the phantom used to obtain the image in FIG. 3.8 indicating slices taken through them which are given in parts B–I.
B and C: slices taken through FIG. 3.8.A.
D and E: slices taken through FIG. 3.8.B.
F and G: slices taken through FIG. 3.8.C.
H and I: slices taken through FIG. 3.8.D.

FIG. 3.11. A. Homoucler two-dimensional J-resolved experiment. B. Homonuclear J-resolved imaging experiment with two phase encoded and one frequency encoded spatial dimensions.

FIG. 3.12. $^{31}$P spectra obtained at 32.5 MHz. A. J-spectrum of ATP, 0.5 molar in H$_2$O obtained with the homonuclear two-dimensional J-resolved experiment. B. J-spectrum of ADP, 0.5 molar in H$_2$O, obtained with the homonuclear two-dimensional J-resolved experiment. For parts A and B $\Delta t_1 = 11.1$ msec, 64 blocks collected, 8 acquisitions per block. C. Single-quantum spectrum of ATP. D. Single-quantum spectrum of ADP.

FIG. 3.13. $^{31}$P homonuclear J-resolved image of a phantom consisting of a row of 6 equally spaced vials parallel to the direction of the x-gradient containing alternately ATP and ADP, 0.5 molar in H$_2$O. Diameter of vials 6 mm, distance between centers of adjacent vials 7 mm. Only a frequency encoding gradient, $G_x$, was used. Information encoded in image dimensions: F1 = J, F2 = X + $\delta$. $G_x = 0.27$ Gcm$^{-1}$, $\Delta t_1 = 20$ msec, 64 blocks collected, 200 acquisitions per block, total acquisition time = 7.4 hours.

ZERO-QUANTUM SPECTROSCOPY IN AN INHOMOGENEOUS MAGNETIC FIELD

Zero-quantum coherences, unlike single-quantum coherences, cannot be prepared directly by the application of a single 90° pulse to a spin system at equilibrium, and neither can they be observed directly. Consequently a more sophisticated pulse sequence is needed which can generally be broken down into three parts.

Firstly it is necessary to prepare the zero-quantum coherence, secondly it must be allowed to evolve, and thirdly it must be converted back into single-quantum coherence, which can be directly observed. This must be done in such a way that the observed single-quantum coherence is modulated as a function of the extent of zero-quantum coherence evolution. The most common pulse sequence used to do this is given in FIG. 2.1.

The first 90° pulse creates in-phase single-quantum coherence in the rotating frame which evolves during the preparation period $\tau$ under the influence of chemical shift and scalar couplings into antiphase single-quantum coherence. The antiphase single-quantum coherence is converted into multiple-quantum coherences by the second 90° pulse, and these evolve during $t_1$. Next the third 90° pulse partially converts them back into antiphase single-quantum coherences, the amplitudes of which are modulated as a function of the extent of multiple-quantum coherence evolution. The invisible antiphase single-quantum coherences rephase into visible single-quantum coherences which are detected. If n experiments are performed incrementing $t_1$ by a constant amount, $\Delta t_1$, each time a data matrix $S(t_1, t_2)$ will be obtained. Fourier transformation with respect to $t_2$, the rows of the matrix, will yield the single-quantum spectrum corresponding to each value of $t_1$. Fourier transformation with respect to $t_1$, the columns of the matrix, will yield the multiple-quantum spectrum with a sweep width given by $\frac{1}{2}\Delta t_1$ Hz.

There are two practical methods of separating out the various orders of multiple-quantum coherence, by phase cycling or by using a pulsed magnetic field gradient.

Phase cycling methods make use of the differing sensitivities of different orders of multiple-quantum coherence to a phase change of a radiofrequency pulse. If a pulse is phase shifted by an angle $\phi$, then a p-order multiple-quantum coherence will experience a phase shift of p$\phi$. There are several different methods of separation based on phase properties. In the most widely used of these for each value of $t_1$ several experiments are performed with different excitation or detection pulse phases and a linear combination of the Free Induction Decays (FIDs) taken. This results in the cancellation signal due to unwanted orders. For the basic multiple-quantum experiment given in FIG. 2.1 the phase cycling scheme used to select zero-quantum coherence is given in Table 1. This assumes only the ability to phase shift by multiples of 90° (an unavoidable constraint on most NMR spectrometers) and consequently also lets through fourth and eighth order multiple-quantum coherence, though in isotropic solution the relative intensities of these orders are usually small. To be most effective the magnetization must be allowed to return to equilibrium after each experiment ($>5T_1$), and it also necessitates the performing a minimum number of four experiments for each value of $t_1$.

TABLE 1

| Phase cycling schemes for multiple-quantum coherence order selection. | | | | |
|---|---|---|---|---|
| Pulse Phase $\Phi$ | 0° | 90° | 180° | 270° | Orders selected |
| Receiver phase | 0° | | | | 0 1 2 3 4 5 6 7 8 |
| | 0° | | 0° | | 0 2 4 6 8 |
| | 0° | | 180° | | 1 3 5 7 |
| | 0° | 0° | 0° | 0° | 0 4 8 |
| | 0° | 180° | 0° | 180° | 2 6 |

The pulsed field gradient method of separating out the different orders of multiple-quantum coherence makes use of the differing sensitivities of different orders of multiple-quantum coherence to magentic field inhomogeneity.

This has the same theoretical basis as phase sensitivity discussed above. An offset $\Delta\omega$ caused by magnetic field inhomogeneity is experienced by a p-order multiple-quantum coherence as $p\Delta\omega$. Consequently if a magnetic field gradient is applied for a time T during $t_1$ within the basic multiple-quantum experiment dephasing proportional to pT will occur. After being converted back into single-quantum coherence magnetization resulting from p-order multiple-quantum coherence can be rephased by applying the same magnetic field gradient for p times as long. This is because single-quantum coherence will only dephase or rephase at 1/p the rate of p-order multiple-quantum coherence. Other orders will remain dephased. To select zero-quantum coherence which is unaffected by magnetic field inhomogeneity it is only necessary to apply the magnetic field gradient once, during $t_1$ to dephase all other orders present, FIG. 2.2.

Due to its greater flexibility and efficiency the pulsed field gradient method of order selection is used herein unless otherwise stated.

In an inhomogeneous magnetic field the pulse sequence given in FIG. 2.2 does not work for two reasons. Firstly magnetization will dephase during the preparation period, and secondly invisible antiphase single-quanum coherence created by the third 90° pulse will dephase before it can evolve into visible in-phase magnetization. This problem can be solved by the introduction of two 180° pulses into the pulse sequence. These refocus dephasing due to magnetic field inhomogeneity, one in the centre of the preparation period and one in the centre of an additional refocussing period after the third 90° pulse, FIG. 2.3, to form the refocussed zero-quantum experiment. This sequence is similar to one introduced by Sorensen, Levitt and Ernst in the context of multiple-quantum filtering.

The effects of the refocussed zero-quantum experiment on a spin system can be described in terms of the product operator formalism. For an $AX_2$ spin system, neglecting transverse relaxation, this is as follows:

The first $90_x°$ pulse produces magnetization along the $-y$ axis of the rotating frame, $-(I_{Ay}+2I_{Xy})$. This subsequently evolves during the preparation period $\tau$ due to the Hamiltonian $2\pi J_{AX}\tau I_{Az}I_{Xz}$, chemical shift evolution being canceled out by the $180_y°$ pulse at $\tau/2$.

$$-(I_{Ay} + 2I_{Xy}) \xrightarrow{2\pi J_{AX}\tau I_{Az}I_{Xz}} -I_{Ay}\cos^2(\pi J_{AX}\tau) + \quad (2.1)$$

$$2I_{Ax}I_{Xz}\cos(\pi J_{AX}\tau)\sin(\pi J_{AX}\tau) + 2I_{Ax}I_{Xz}\sin(\pi J_{AX}\tau)\cos(\pi J_{AX}\tau) +$$

$$4I_{Ay}I_{Xz}I_{Xz}\sin^2(\pi J_{AX}\tau) - 2I_{Xy}\cos(\pi J_{AX}\tau) + 4I_{Xx}I_{Az}\sin(\pi J_{AX}\tau)$$

The second $90_x°$ pulse converts the first and fifth terms of equation 2.1 into longitudinal magnetisation $I_{Az}$ and $2I_{Xz}$. This will be converted back into $I_{Ay}$ and $2I_{Xy}$ by the third 90° pulse and will contribute to the peak at 0.0 Hz in the F1 dimension of the data set as it is not modulated with respect to $t_1$. The fourth term is converted into the term $4I_{Az}I_{Xy}I_{Xy}$, zero-quantum coherence between the two X spins antiphase with respect to the passive A spin. This will not evolve due to scalar couplings or chemical shift durin9 $t_1$, and hence when converted back into sin9 1e-quantum coherence will only contribute to the peak at 0.0 Hz in F1. The second, third, and sixth terms of the equation are converted into two-spin coherences $2I_{Ax}I_{Xy}$, $2I_{Ax}I_{Xy}$, and $2I_{Xx}I_{Ay}$ respectively which contain both zero- and double-quantum coherence. Pure zero-quantum coherence is given byr $$(\tfrac{1}{2})(2I_{Ax}I_{Xx}+2I_{Ay}I_{Xy})=\{ZQT\}_x \quad (2.2)$$

and $$(\tfrac{1}{2})(2I_{Ay}I_{Xx}-2I_{Ax}I_{Xy})=\{ZQT\}_y \quad (2.3)$$

Therefore the amplitude of zero-quantum coherence present after the second $90_x°$ pulse is given by:

$$2\sin(\pi J_{AX}\tau) - 2\cos(\pi J_{AX}\tau)\sin(\pi J_{AX}\tau) = \{ZQT\}_y. \quad (2.4)$$

Non-zero multiple-quantum coherences will be dephased by the pulsed magnetic field gradient. Zero-quantum coherences will evolve during $t_1$ under the influence of both chemical shift and scalar couplings to passive spins, the effective chemical shift is given by:

$$\Omega_{eff}=\Omega_A-\Omega_X \quad (2.5)$$

and the effective scalar coupling by:

$$J_{eff}=J_{AX}-J_{XX} \quad (2.6)$$

The extent of evolution during $t_1$ is given by:

$$\{ZQT\}_y \xrightarrow{\pi J_{AX}t_1 2I_{Az}I_{Xz}} \xrightarrow{\Omega_A t_1 I_{Az}} \xrightarrow{\Omega_X t_1 I_{Xz}} \quad (2.7)$$

$$\{ZQT\}_y\cos(\pi J_{eff}t_1)\cos(\Omega_{eff}t_1) -$$

$$2I_{Xz}\{ZQT\}_x\sin(\pi J_{eff}t_1)\cos\Omega_{eff}t_1) -$$

$$\{ZQT\}_x\cos(\pi J_{eff}t_1)\sin(\Omega_{eff}t_1) -$$

$$2I_{Xz}\{ZQT\}_y\sin(\pi J_{eff}t_1)\sin(\Omega_{eff}t_1)$$

After $t_1$ a third $90_x°$ pulse is applied:

$$\{ZQT\}_y \xrightarrow{(\pi/2)(I_{Ax} + I_{Xx})} (\tfrac{1}{2})(2I_{Az}I_{Xx} + 2I_{Ax}I_{Xz}) \quad (2.8)$$

$$\quad (2.9)$$

$$2I_{Xz}\{ZQT\}_x \xrightarrow{(\pi/2)(I_{Ax} + I_{Xx})} (\tfrac{1}{2})(4I_{Xy}I_{Ax}I_{Xx} + 4I_{Xy}I_{Az}I_{Xz})$$

$$\{ZQT\}_x \xrightarrow{(\pi/2)(I_{Ax} + I_{Xx})} (\tfrac{1}{2})(2I_{Ax}I_{Xx} + I_{Az}I_{Xz}) \quad (2.10)$$

$$\quad (2.11)$$

$$2I_{Xz}\{ZQT\}_y \xrightarrow{(\pi/2)(I_{Ax} + I_{Xx})} (\tfrac{1}{2})(4I_{Xy}I_{Az}I_{Xx} - 4I_{Xy}I_{Ax}I_{Xz})$$

The terms on the right side of equation 2.8 are antiphase single-quantum ooherences which will be observed upon evolving into in-phase single-quantum coherence. The terms on the right side of equation 2.9 are three-spin coherence, which is not directly observable, and antiphase single-quantum coherence. The latter does not become observable either as $J_{XX}=0$. The terms on the right of equation 2.10 are unaffected zero-quantum coherence and longitudinal two-spin order respectively. The terms on the right of equation 2.11 are antiphase zero-quantum coherence.

During the refocussing period $\tau'$ the antiphase single-quantum coherence formed by the third $90_x°$ pulse (on the right of equation 2.8) will evolve under the influence of scalar couplings, chemical shift evolution being canceled out by the $180_y°$ pulse at $\tau'/2$, thus:

$$(\tfrac{1}{2})(2I_{Az}I_{Xx} - 2I_{Ax}I_{X_2}) \xrightarrow{\pi J_{AX}\tau I_{Az}I_{X_2}} \quad (2.12)$$

$$(\tfrac{1}{2})[2I_{Az}I_{Xx} + \cos(\pi J_{AX}\tau') + I_{Xy}\sin(\pi J_{AX}\tau') -$$

$$2I_{Ax}I_{Xz}\cos^2(\pi J_{AX}\tau') - 4I_{Ay}I_{Xz}I_{Xz}\cos(\pi J_{AX}\tau')\sin(\pi J_{AX}\tau') -$$

$$I_{Ay}\sin(\pi J_{AX}\tau')\cos(\pi J_{AX}\tau') + I_{Ax}I_{Xz}\sin^2(\pi J_{AX}\tau')]$$

Consequently the amplitude of in-phase, and hence visible, single-quantum coherence present at time $\tau'$ originating from the zero-quantum coherence consisting of the spins A and X is given by:

$$I_{Xy}+I_{Ay}=(\tfrac{1}{2})\{\sin(\pi J_{AX}\tau') \\ -[\sin(\pi J_{AX}\tau')\cos(\pi J_{AX}\tau')]\} \quad (2.13)$$

It should be noted that this has the same form as equation 2.4.

The refocussed zero-quantum experiment (FIG. 2.3) was used to obtain the zero-quantum spectra of the amino acids L-alanine, L-valine, L-threonine, and L-asparagine in a homogeneous magnetic field, FIG. 2.4 A–D. The homogeneity of the magnetic field was then degraded, FIG. 2.5, and the zero-quantum spectrum oi a mixture of the amino acids obtained with the same pulse sequence and the same parameters, Figure 2.4 E. The zero-quantum coherences of the individual components of the mixture are clearly discernible whereas the corresponding single-quantum spectrum is of little use. Consequently the data set, $s(t_1,t_2)$, was only Fourier transformed with respect to $t_1$. As the FID in $t_2$ decayed very rapidly as a consequence of the magnetic field inhomogeneity only the $t_1$ FIDs within the first 2–3 milliseconds of $t_2$ could be co-added to build up signal-to-noise (S/N). In the case of extreme inhomogeneity only the first point of the $t_2$ FID, collected at the top of the spin-echo, may be of use. Each zero-quantum spectrum took under 15 minutes to acquire, which is by no means prohibitive when one considers the lack of alternatives in an inherently inhomogeneous magnetic environment such as one might find in the context of NMR imaging.

Editing Zero-Quantum Coherence Spectra

Up until the present time most practitioners of zero-quantum NMR have been more concerned with ensuring that they obtain the whole of the zero-quantum spectrum rather than only part of it, although there have been qualified exceptions From equation 2.4 it can be seen that the efficiency of excitation of zero-quantum coherence is dependent upon the scalar couplings of the spins and the length of the preparation period $\tau$. Consequently the absolute and relative intensities of the zero-quantum coherences observed will vary for a given spin system from one value of $\tau$ to another. At certain values, whenever equation 2.4 is equal to zero in the case of an $AX_2$ spin system, the zero-quantum coherence will be absent from the spectrum entirely. The dependency upon scalar couplings and $\tau$ will vary from one spin system to another, although it will be generally easy to calculate As has been noted above, magnetic field inhomogeneity may limit the effective data acquisition time. to 2–3 milliseconds during which time the spin system will undergo negligible evolution due to scalar couplings, assuming the coupling constants concerned are not large. Consequently the intensity of magnetization detected originating from zero-quantum coherence, and hence the intensity of that zero-quantum coherence observed in the resultant spectrum, will be dependent upon the relevant scalar couplings and the length of the refocussing period $\tau'$. This is analogous to the dependency oi zero-quantum excitation upon scalar couplings and $\tau$ discussed above. For an $AX_2$ spin system this given in equation 2.13, and can be easily calculated for other spin systems Both preparation and refocussing periods provide an opportunity to edit the observed signal. The importance of this ability, particularly at lower fields, iS readily appreciated when one considers that in zero-quantum space the problem of resonance overlap in a spectrum is often worse than for its single-quantum counterpart. This is because zero-quantum coherences only occur at the difference in resonance frequencies of two coupled spins and therefore usually occur within a narrower frequency range. The editing effects of varying the preparation and refocussing periods upon a zero-quantum spectrum are demonstrated in FIG. 2.6 for L-threonine.

Non-Selective Excitation and Detection of Zero-Quantum Coherence in an Inhomogeneous Maqnetic Field Given the constraints imposed upo the detection of zero-quantum coherence in inhomogeneous magnetic fields by preparation and refocussing times, how can one be certain of a reasonably uniform excitation and detection of zero-quantum coherences?

One possibility would be to repeat the experiment for several different values of $\tau$ and $\tau'$ and add the resulting spectra together. One might, ior example, add together the spectra in FIG. 2.6 A and C to obtain complete zero-quantum spectrum of L-threonine. The major disadvantage of this method is the extra time it involves. Alternatively, Ernst and co-workers have proposed the use of an "accordion" preparation period in which the preparation period is incremented by $n\Delta t_1$, becoming $\tau+nt_1$. Usually n is set to $\leq 0.25$ so that the J-encoding it will cause to be superimposed on top of the zero-quantum spectrum will be scaled down sufficiently So as not to distort it significantly. It works because the length of the preparation period will correspond to that needed to excite each zero-quantum coherence for at least part of the experiment, assuming that the time range is adequate. In FIG. 2.7A the preparation subsequence of the refocussed zero-quantum experiment has been replaced with the "accordion" preparation period. Despite ensuring excitation of all zero-quantum coherence, this sequence does not ensure that all will be detected. This is because it assumes the effective acquisition time to be long enough for all components oi invisible antiphase magnetization to evolve through visible in-phase magnetization and hence not to be edited out of the spectrum by choosing a certain value of the refocussing time. This would indeed be the case in a homogeneous field where the effective acquisition time is relatively long, but not in an inhomogeneous field where the effective acquisition time is only a couple of milliseconds. Consequently despite the "accordion" preparation period the refocussing period will still cause editing, FIG. 2.8A. This problem was overcome by using an "accordion" refocussing as well as preparation period, FIG. 2.7B. This pulse sequence was used to obtain the spectrum in FIG. 2.8B which is clearly more uniiorm than its counterpart obtained with a constant refocussing period in FIG. 2.8A. The parameters used were the same in both cases.

Both sequences were found to produce significantly less intense peaks, reflected in the poorer S/N compared to the refocussed zero-quantum experiment (FIG. 2.6) although twice as many acquisitions per block were collected. Hence the total acquisition time was twice as long as that used for the reiocussed zero-quantum experiment in FIG. 2.5. This is inherent in accordion techniques. Varying the length of the preparatio and refocussing periods results in the creation and detection of a given zero-quantum coherence being at an optimum for only part of the experiment whereas the fixed preparation and refocussing interval experiment results in the zero-quantum coherence chosen being optimised throughout the whole of the experiment.

Homonuclear Broad-Band Decoupled Zero-Quantum Coherence Spectroscopy

Zero-quantum spectra have several major disadvantages over their single-quantum counterparts. Among these are the time they take to acquire (each spectrum is a two-dimensional experiment) and the narrow frequency range relative to the corresponding single-quantum spectra over which they occur. The latter feature is a direct result of the property of zero-quantum coherences which occur at the difference in resonanoe frequencies of two coupled spins. Often this leads to overlapping, a more crowded and hence less easily interpretable spectrum. This problem can be overcome by manipulating the preparation and refocussing times to edit the spectrum. Time consuming trial and error is required if the type of spin system and its coupling constants are not known. Alternatively the resolution of the spectrum can be increased to try and resolve crowded and overlapping resonances by increasing the number oi $t_1$ increments used: this also takes time. A third alternative which might alleviate both of the problems referred to above would be to decouple the entire zero-quantum spectrum. This would lead to a much sampler spectrum, possibly requiring lower resolution and hence less acquisition time. If all the intensities of a former multiplet now went into one peak fewer acquisitions would be required to build up comparable S/N.

A pulse Bequenoe was designed to accomplish the broad-band decoupling of zero-quantu spectra which is shown in FIG. 2.9.

It has been known for some time how to produce homonuclear broad-band decoupled single-quantum spectra. This was originally achieved by taking a projection through a two-dimensional J-resolved spectrum. Later a pulse sequence was designed specifically to obtain homonuclear broad-band decoupled spectra which was subsequently adapted to obtain a Jeener spectrum decoupled in one dimension The underlying principles oi decoupling single-quantum and zero-quantum spectra are fundamentally the same. It is most easily understood by considering what it takes to put information into the F1 dimension of a two-dimensional spectrum. For each value of $t_1$ the property of interest must vary in such a way that the acquired signal is modulated as a function of $t_1$ due to this property. For example, in a zero-quantum experiment such as that in FIG. 2.3, at each value of $t_1$ a given zero-1uantum coherence will have evolved to a different extent due to chemical shift, and this modulates the acquired signal (equations 2.7–2.13). Likewise a corresponding evolution due to scalar couplin9s results in their modulating the acquired signal as well. This gives rise to a zero-quantum spectrum complete with multiplet structure when Fourier transformed with respect to $t_1$. Thereiore, to decouple a zero-quantum spectrum all one has to do is to ensure that while the extent of chemical shift evolution varies with $t_1$, the extent of scalar coupling evolution does not. It has been well documented that a 180° pulse applied to a homonuclear spin system, as in a spin-echo experiment, has the effect of reversing the evolution of the spin system due to chemical shift and magnetic field inhomogeneities but leaves evolution due to scalar couplings unaffected. This applies equally to zero- and single-quantum coherences.

In the decoupled zero-quantum experiment, FIG. 2.9, the zero-quantum evolution time, $t_d$, is constant. Therefore the extent oi evolution due to scalar couplings of a zero-quantum coherence created by the second 90° pulse will be constant, being unaffected by the position of the 180° pulse within it. Thus the acquired signal will not be modulated due to scalar couplings in the $t_1$ dimension of the data set $S(t_1,t_2)$. The extent of chemical shift evolution on the other hand will vary irom a maximum at $t_1/2=0$ to zero when $t_1/2=t_d/2$, chemical shift evolution at this point in the experiment being completely reversed, to a maximum again at $t_1/2 = t_d$. This results in the acquired siqnal being modulated with respect to $t_1$ due to chemical shift evolution. Fourier transformation with respect to $t_1$ will thereiore yield the decoupled zero-quantum spectrum.

For an $AX_2$ spin system the evolution of a zero-quantum coherence between spins A and X during $t_d$ can be described thus:

$$\{ZQT\}_y \xrightarrow{\pi J_{AX}(t_1/2)2I_{Az}I_{Xz}} \xrightarrow{\Omega_A(t_1/2)I_{Az}} \xrightarrow{\Omega_X(t_1/2)I_{Xz}} \quad (2.14)$$

$$\xrightarrow{\pi(I_{Ax}+I_{Xx})} \xrightarrow{\pi J_{AX}(t_d-t_1/2)2I_{Az}I_{Xz}}$$

$$\xrightarrow{\Omega_A(t_d-t_1/2)I_{Az}} \xrightarrow{\Omega_X(t_d-t_1/2)I_{Xz}}$$

$$\{ZQT\}_y\cos[\Omega_{eff}(t_1-t_d)]\cos(\pi J_{eff}t_d) + \{ZQT\}_x\sin[\Omega_{eff}(t_1-$$

$$t_d)]\cos(\pi J_{eff}t_d) - 2I_{Xz}\{ZQT\}_x\cos[\Omega_{eff}(t_1-t_d)]\sin(\pi J_{eff}t_d) +$$

$$2I_{Xz}\{ZQT\}_y\sin[\Omega_{eff}(t_1-t_d)]\sin(\pi J_{eff}t_d)$$

Clearly all scalar coupling evolution is independent of $t_1$.

An example of zero-quantum decoupling is given in FIG. 2.10 B ior a solution of ethanol and 2-propanol in $D_2O$, and the corresponding undecoupled zero-quantum spectrum in FIG. 2.10 A.

From an examination of equation 2.14 it can be seen that whether a particular zero-quantum coherence is present as the in-phase terms $2I_{Ax}I_{Xx}$, $2I_{Ay}I_{Xy}$, $2I_{Ax}I_{Xy}$, and $2I_{Ay}I_{Xx}$, or as antiphase terms such as $4I_{Ay}I_{Xy}I_{Xz}$ at the end of $t_d$ is dependent only upon the coupling constacts concerned and $t_d$. It follows that a coherence may be completely in-phase or completely antiphase, or, more normally, partially both at the end of $t_d$ for all values of $t_1$. This has important consequences as can be seen from Table II. The table shows the eiects of the pulse $\alpha=90°$ at the end of $t_d$ on the product operators present at that time for an $AX_2$ spin system.

TABLE II

Effects of the pulse $\alpha = 90°$ on the product operators present at the end of the evolution time $t_d$ of the broad-band decoupled zero-quantum experiment for an $AX_2$ spin system.

| Product operators present before pulse $\alpha$ | Product operators present after pulse $\alpha = 90°$ (visible terms in bold type) |
|---|---|
| $2I_{Ay}I_{Xx}$ | $2I_{Az}I_{Xx}$ |
| $-2I_{Ax}I_{Xy}$ | $-2I_{Ax}I_{Xz}$ |
| $2I_{Ax}I_{Xx}$ | $2I_{Ax}I_{Xx}$ |
| $2I_{Ay}I_{Xy}$ | $2I_{Az}I_{Xz}$ |
| $-4I_{Ax}I_{Xx}I_{Xz}$ | $4I_{Ax}I_{Xx}I_{Xy}$ |
| $-4I_{Ay}I_{Xy}I_{Xz}$ | $4I_{Az}I_{Xz}I_{Xy}$ |
| $4I_{Ay}I_{Xx}I_{Xz}$ | $-4I_{Az}I_{Xx}I_{Xy}$ |
| $-4I_{Ax}I_{Xy}I_{Xz}$ | $4I_{Ax}I_{Xz}I_{Xy}$ |

Clearly only the in-phase terms $2I_{Ax}I_{Xy}$ and $2I_{Ay}I_{Xx}$ are converted into antiphase single-quantum coherence which will be visible after rephasing. In other words, only that part of a zero-quantum coherence which is in-phase at the end of $t_d$ will be observed. Therefore $t_d$ can be chosen such that all of a zero-quantum coherence is only present as antiphase magnetization at the end of the period and hence will be edited out of the observed zero-quantum spectrum. This is demonstrated for a solution of ethanol and 2-propanol in $D_2O$ in FIG. 2.10 C and D where 2-propanol and ethanol respectively have been edited out of the spectrum. The graph in FIG. 2.11 shows how the intensities of the components of the above solution were found to vary with $t_d$ for $a=90°$. These intensities can be easily predicted by constructing the appropriate product operators. The intensity of the zero-quantum coherence of an $AX_n$ spin system was found to be proportional to $\cos^{n-1}(T_d J_{eff} \pi)$, and this dependency is reflected by 2-propanol in FIG. 2.11.

For spin systems with more than two different coupled spins the situation is somewhat different. Even when $\alpha = 90°$ some antiphase terms of a zero-quantum coherence will be converted into antiphase single-quantum coherence by the pulse $\alpha$ which will be capable of refocussing and hence will be observed thus thwarting attempts at editing. For example, for an AMX spin system a zero-quantum coherence between spins A and M will evolve during $t_d$ into antiphase terms including $4I_{Ay}I_{My}I_{Xz}$. A 90° pulse will convert this term into 4Ihd $A_zI_{Mz}I_{Xy}$, antiphase magnetization of the passive spin X with respect to the spins A and M. As neither $J_{XA}$ nor $J_{XM}$ is equal to zero it will evolve into observable in-phase single-quantum coherence. Hence the zero-quantum coherence between spins A and M will be observed even if $t_d$ is set so that all of it is antiphase at the end of the evolution period. A corresponding antiphase zero-quantum coherence for an $AX_n$ spin system might be $4I_{Ay}I_{Xy}I_{Xz}$. On application of a 90° pulse this term would become $4I_{Az}I_{Xz}I_{Xy}$, antiphase magnetization of the passive spin X with respect to the spins A and X. As $J_{XX}=0$ it would never rephase into visible inphase single-quantum coherence and hence editing will be effective.

TABLE III

Effects of a pulse $\alpha$ on the product operators present at the end of the evolution time $t_d$ of the broad-band decoupled zero-quantum experiment for an $AX_2$ spin system.

| Product operators present before pulse $\alpha$ | Product operators present after pulse $\alpha$ (visible terms in bold type) | |
|---|---|---|
| $2I_{Ay}I_{Xx}$ | $2I_{Ay}I_{Xx}\cos\alpha$ | $2I_{Az}I_{Xx}\sin\alpha$ |
| $-2I_{Ax}I_{Xy}$ | $-2I_{Ax}I_{Xy}\cos\alpha$ | $-2I_{Ax}I_{Xz}\sin\alpha$ |
| $2I_{Ax}I_{Xx}$ | $2I_{Ax}I_{Xx}$ | |
| $2I_{Ay}I_{Xy}$ | $2I_{Ay}I_{Xy}\cos^2\alpha$ | $2I_{Ay}I_{Xz}\cos\alpha\sin\alpha$ |
| | $2I_{Az}I_{Xy}\sin\alpha\cos\alpha$ | $2I_{Az}I_{Xz}\sin^2\alpha$ |
| $-4I_{Ax}I_{Xx}I_{Xz}$ | $-4I_{Ax}I_{Xx}I_{Xz}\cos\alpha$ | $4I_{Ax}I_{Xx}I_{Xy}\sin\alpha$ |
| $-4I_{Ay}I_{Xy}I_{Xz}$ | $-4I_{Ay}I_{Xy}I_{Xz}\cos^3\alpha$ | $4I_{Ay}I_{Xy}I_{Xy}\cos^2\alpha\sin\alpha$ |
| | $-4I_{Ay}I_{Xz}I_{Xz}\cos^2\alpha\sin\alpha$ | |
| | $-4I_{Az}I_{Xy}I_{Xz}\cos^2\alpha\sin\alpha$ | |
| | $4I_{Ay}I_{Xy}I_{Xy}\cos\alpha\sin^2\alpha$ | |
| | $4I_{Ay}I_{Xy}I_{Xy}\cos\alpha\sin^2\alpha$ | |
| | $-4I_{Az}I_{Xz}I_{Xz}\cos\alpha\sin^2\alpha$ | $4I_{Az}I_{Xz}I_{Xy}\sin^3\alpha$ |
| $4I_{Ay}I_{Xx}I_{Xz}$ | $4I_{Ay}I_{Xx}I_{Xz}\cos^2\alpha$ | $-4I_{Ay}I_{Xx}I_{Xy}\cos\alpha\sin\alpha$ |
| | $4I_{Az}I_{Xx}I_{Xz}\cos\alpha\sin\alpha$ | |
| | $-4I_{Az}I_{Xx}I_{Xy}\sin^2\alpha$ | |
| $-4I_{Ax}I_{Xy}I_{Xz}$ | $-4I_{Ax}I_{Xy}I_{Xz}\cos^2\alpha$ | $-4I_{Ax}I_{Xy}I_{Xy}\cos\alpha\sin\alpha$ |
| | $-4I_{Ax}I_{Xz}I_{Xz}\cos\alpha\sin\alpha$ | |
| | $4I_{Ax}I_{Xz}I_{Xy}\sin^2\alpha$ | |

One problem is how to ensure that one obtains the complete decoupled zero-quantum spectrum. There are two possible solutions: firstly, the spectra obtained with several different values of $t_d$ can be co-added, or, alternatively, the pulse $\alpha$ can be varied from 90°. The effects of an arbitrary pulse $\alpha$ on the product operators present for an $AX_2$ spin system after $t_d$ can be evaluated from Table III. Some of the antiphase zero-quantum coherence terms, none of which become visible when $\alpha = 90°$ or an integer multiple of it, give rise to terms which will become visible after rephasing when $\alpha$ does not meet this condition. Terms which will be observed after rephasing are in bold type in Table III. Setting $\alpha = 45°$ will result in antiphase zero-quantum coherence being converted in potentially observable terms with maximum efficiency. Generally, the more nuclei that are involved in an antiphase zero-quantum coherence product operator the less efficient will be its conversion into potentially observable terms The experiments in FIG. 2.10 B–D were repeated with $\alpha = 45°$ and these results are shown in FIG. 2.12. In each case both coherences are visible, and 2-propanol gives rise to the most intense resonance even when the value of $t_d$ was used which had previously, when $\alpha = 90°$, edited it out. This reflects three factors. Firstly, it is dependent upon the proportion of antiphase zero-quantum coherence terms for each spin system which will yield potentially observable terms when acted upon by the pulse $\alpha$. Secondly, it reflects the relative size of these terms, and thirdly, the efficiency with which they are converted into potentially observable terms. For an $AX_2$ spin system the size of these antiphase zero-quantum coherence terms can be evaluated from equation 2.14, and their conversion efficiency can be evaluated from Table III.

It should be noted that the coherence intensities of FIG. 2.11, unlike FIG. 2.10, are no longer symmetrical about 0.0Hz. This is due to the preferential transfer of the positive zero-quantum frequency to one of the participating spins and that of the negative frequency to the other induced by varying $\alpha$ from 90°. This phenomenon will be discussed in detail later.

Resolution in the F1 spectrum is dependent upon the number of $t_1$ increments, n, used and hence upon $t_d$ as $t_d \geq n\Delta t_1$. This is potentially a limitation for molecules where spin-spin relaxation times are short, particularly when one considers that up to 200 milliseconds more will be taken up by the preparation and refocussing periods. This would seem to rule out most in vivo applications of this experiment.

It has previously been demonstrated that two dimensional zero-quantum spectra can be used to map spin-spin coupling networks in a homogeneous magnetic field, most recently in an experiment which gives rise to a spectrum with a similar format to that of the SECSCY experiment. The usefulness of these experiments could be enhanced by decoupling the zero-quantum coherences, improving resolution and hence usefulness.

Sinqle-Quantum J-Resolved Broad-Band Decoupled Zero-quantum Spectroscopy

One of the major problems for determining connectivity between zero-quantum coherences, and hence in determining the structure of chemical species solely from such coherences, lies in their multiplet structure.

The coupling constants and also the multiplet structure of zero-quantum coherences are not, on the whole, the same as their single-quantum counterparts. In general the effective coupling constant of a multiple-quantum coherence consisting of spins k coupling to a passive spin m is given by:

$$J_{eff} = \sum_k \Delta m_k J_{km} \tag{2.15}$$

where $\Delta m_k = \pm 1$, the change in the magnetic quantum number of spin k. Consequently not only are the effective coupling constants different from those found on single-quantum coherences, but a spin which can participate in more than one zero-quantum coherence may exhibit different coupling constants in each case. Clearly this makes the elucidation of spin-spin coupling networks, and hence identifying chemical species, difficult. It would seem therefore that if zero-quantum coherences exhibited single-quantum multiplet structure and coupling constants that their use would be greatly enhanced in this respect. But, it should be noted, the problem is not quite so simple to overcome. Each zero-quantum coherence is a coherence between two spins and hence if one were somehow to replace the zero-quantum multiplet structure one would be doing so with not one but two single-quantum ones. This, it would seem, would not leave one any better off. Therefore not only does one have to replace the zero- with single-quantum multiplet structure but one has to do it selectivly. The single-quantum multiplet structure of one participating spin must be found only at the positive zero-quantum frequency and that of the other only at the negative zero-quantum frequency.

Given these requirements, the solution would seem to present itself as follows. Firstly decouple the zero-quantum spectrum. Secondly transfer the positive zero-quantum coherence frequency encoding to one participating spin and the negative to the other. Thirdly J-encode the resulting single-quantum coherences before acquisition.

The decoupling of zero-quantum coherences has been discussed previously. It was noted that if $\alpha$ is varied from 90° in the decoupled zero-quantum experiment preferential transfer of coherence will occur. The positive zero-quantum frequency will be preferentially transferred to one participating spin and the negative zero-quantum frequency to the other. This is possible because varying $\alpha$ from 90° results in phase instead of amplitude modulation of single-quantum coherence originating from zero-quantum coherence. This makes possible quadrature-phase detection with respect to $t_1$. With phase modulation, unlike amplitude modulation, positive and negative frequencies encoded can be distinguished.

From Table II and equations 2.2, 2.3 and 2.14 it can be seen that for an AX$_2$ spin system the potentially observable antiphase single-quantum coherence present after the pulse $\alpha = 90°$ originating from zero-quantum coherence in the broad-band decoupling experiment is given by:

$$\sigma^P(\tau + t_{d+}) = \tag{2.15}$$

$$(2I_{Az}I_{Xx} - 2I_{Ax}I_{Xz})\cos[(\Omega_A - \Omega_X)(t_1 - t_d)]\cos(\pi J_{eff}t_d)$$

Clearly the antiphase single-quantum coherence in equation 2.15 is only amplitude modulated. Therefore positive and negative zero-quantum frequencies are indistinguishable and will both be carried by both participating spins.

From Table III and equations 2.2, 2.3 and 2.14 it can be seen that for an AX$_2$ spin system the general expression for potentially observable antiphase single-quantum coherence created from zero-quantum coherence by an arbitrary pulse $\alpha$ for an X spin is given by:

$$\sigma_X^P(\tau + t_{d+}) = \tag{2.16}$$

$$2I_{Az}I_{Xx}\cos[(\Omega_A - \Omega_X)(t_1 - t_d)]\cos(\pi J_{eff}t_d)\sin\alpha +$$

$$2I_{Az}I_{Xy}\sin[(\Omega_A - \Omega_X)(t_1 - t_d)]\cos(\pi J_{eff}t_d)\sin\alpha\cos\alpha$$

and for an A spin:

$$\sigma_A^P(\tau + t_{d+}) = \tag{2.17}$$

$$-2I_{Ax}I_{Xz}\cos[(\Omega_A - \Omega_X)(t_1 - t_d)]\cos(\pi J_{eff}t_d)\sin\alpha +$$

$$2I_{Ay}I_{Xz}\sin[(\Omega_A - \Omega_X)(t_1 - t_d)]\cos(\pi J_{eff}t_d)\sin\alpha\cos\alpha -$$

$$4I_{Ax}I_{Xz}\sin[(\Omega_A - \Omega_X)(t_1 - t_d)]\sin(\pi J_{eff}t_d)\sin\alpha\cos\alpha -$$

$$4I_{Ay}I_{Xz}\cos[(\Omega_A - \Omega_X)(t_1 - t_d)]\sin(\pi J_{eff}t_d)\sin\alpha\cos^2\alpha$$

Both spins now have two orthogonal components of antiphase single-quantum coherence originating from in-phase zero-quantum coherence (the first two terms in equations 2.16 and 2.17). One is modulated by $\cos[(\Omega_A - \Omega_X)(t_1 - t_d)]$ and the other by $\sin[(\Omega_A - \Omega_X)(t_1 - t_d)]$ in each case. Hence each spin will be phase modulated as a function of the extent of chemical shift evolution of the parent zero-quantum coherence making possible quadrature-phase detection with respect to $t_1$. There is an important difference between equations 2.16 and 2.17, in that the latter has a negative term. This results in the sense of phase modulation of the two spins being different; one spin will have a positive phase modulation with respect to $t_1$ and the other will have a corresponding negative phase modulation. The direct result of this is that when Fourier transformed with respect to $t_1$ the spin with a positive encoded phase will give rise to the positive zero-quantum peak, and the other, with a negative encoded phase, the negative zero-quantum peak. Hence preferential transfer of coherence is achieved as desired. Unfortunately there are complications. The first two terms of equations 2.16 and 2.17 show different dependencies upon the pulse angle $\alpha$, $\sin\alpha$ and $\sin\alpha\cos\alpha$ respectively. If $\sin\alpha = \sin\alpha\cos\alpha$ then both terms will have equal intensities and pure phase modulation will result, but if they are not equal their modulation can be broken down into two components. One component is phase modulated and the other amplitude modulated. The phase modulated component results in preferential transfer of coherence as described above, but the amplitude modulated magnetization will result in non-preferential transfer, giving rise to both positive and negative zero-quantum frequencies upon Fourier transformation. This reduces the overall efficiency of the preferential transfer process.

As $\alpha$ tends to zero $\sin\alpha$ tends to $\sin\alpha\cos\alpha$ and the efficiency of preferential transfer will increase although the overall signal intensity will decrease. It has been shown elsewhere that the intensity ratio of the two peaks arising from the Fourier transformation of the modulation of one kind spin is proportional to $\tan^2(\alpha/2)$.

The third and fourth terms of equation 2.17 originate from antiphase zero-quantum coherence and, as with the first two terms, consist of phase and amplitude modulated components. This will give rise to preferential transfer with the same efficiency as the first two terms, although with a difference in phase of 90°.

In more complex spin systems coherence may be transferred to spins of a kind not involved in the zero-quantum coherence concerned. The efficiency of this process is significantly reduced when $\alpha$ is reduced from 90° to 45° and consequently is not a significant problem.

Taking the above into account it can be seen that the choice of $\alpha$ will be a compromise between preferential transfer, which becomes more efficient as $\alpha$ tends to zero, and overall signal intensity, which decreases as $\alpha$ tends to zero.

The third requirement is to J-encode the magnetization, as is done in the conventional J-resolved two-dimensional experiment. This is acheived by replacing the purely refocussing subsequence which follows the pulse $\alpha$ by one which refocusses and J-encodes. This is done by replacing the refocussing time $\tau$ with $nt_1$, and retaining the 180° pulse at the centre of this period, FIG. 2.13. This subsequence functions in the same way as a normal J-resolved two-dimensional experiment by introducing phase modulation due to scalar coupling evolution as a function of $t_1$. n is a J-scaling factor: the single-quantum multiplet superimposed on top of the decoupled zero-quantum coherence will be scaled-up relative to the rest of the spectrum by a factor of n. A value of n>1 would increase the resolution of the single-quantum multiplets, although also potentially increasing the overlap of adjacent coherences. A value of n<1 would decrease the resolution of the single-quantum multiplet structure, useful where there is overlapping, although it should be noted that insufficient resolution may lead to cancellation of peaks.

The evolution of invisible antiphase single-quantum coherence into visible in-phase single-quantum coherence and J-encoding both depend upon evolution of the magnetization due to scalar couplings. The central peak of an odd numbered multiplet does not evolve during the J-encoding subsequence. Consequently the central peaks of odd numbered multiplets superimposed upon decoupled zero-quantum coherences will not be observed in this experiment. This is because all single-quantum coherence modulated as a function of the extent of zero-quantum coherence evolution is initially invisible antiphase magnetisation after the pulse $\alpha$. Consequently as they do not evolve due to scalar couplings the central peaks of odd numbered multiplets will remain antiphase and hence invisible. However, this results in only minor inconvenience as the single-quantum multiplet structure of both spins active in the zero-quantum coherence will be present in the resulting spectrum. As the two multiplets must share a coupling constant and as there must be a sufficient number of each kind of spin to cause the observed splitting of the other the absence of a peak can be readily deduced. Any remaining ambiguity may be removed by reference to the conventional zero-quantum spectrum.

The experiment is demonstrated for a solution of 0.1 molar L-alanine in $D_2O$ in FIG. 2.14 C, with the J-scaling factor n set to 2 to improve resolution of the multiplets. A doublet and a quartet are present as expected and exhibit one coupling constant as would be expected for an $AX_3$ spin system. The conventional and broadband decoupled zero-quantum spectra are given in FIGS. 2.14 A and B respectively.

The corresponding spectrum of ethanol is given in FIG. 2.15. The central peak of the triplet is missing though as stated above this is obvious given the necessity of a common coupling constant. In this case it can be seen that non-preferential transfer of coherence is not significant. Due to the overlap of resonances it is not possible to ascertain the extent of non-preferential transfer of coherence for L-alanine. In FIG. 2.16 A is given the corresponding spectrum for 2-propanol. Although the doublet is present as expected the septet, minus its central peak, has an extra doublet sticking out of it due to non-preferential transfer of coherence. As was discussed above, the efficiency of preferential transfer increases as $\alpha$ decreases (proportional to $\tan^2(\alpha/2)$). Therefore by reducing $\alpha$ from 45° to 22.5° this problem can be greatly alleviated, although at the cost of reducing overall signal intensity, FIG. 2.16 B. Interference due to coherence transfer to spins not of a kind involved in a given zero-quantum coherence will also be reduced by reducing the angle $\alpha$. Coherence transfer to such spins can be further reduced by choosing a value of $t_d$ for which the zero-quantum terms that give rise to it are either absent or relatively small. If the optimum value of $t_d$ is not known the experiment can be performed with several different values and the results co-added to obtain the complete spectrum. Likewise to ensure that the initial excitation of zero-quantum coherences is complete and resonably uniform it may be necessary to use several values of $\tau$. However, the spectrum obtained from one experiment will allow one to determine whether or not all the zero-quantum coherences of a represented spin system are present from the number of different scalar couplings exhibited by the multiplets present.

The Reconstruction of Single-Quantum Spectra in Inhomogeneous Magnetic Fields.

Nuclear Magnetic Resonance as a tool in analytical chemistry is centred upon the ability to interpret single-quantum spectra, the area of peaks, their multiplet structures, coupling constants, and chemical shifts Conventional zero-quantum spectra give rise to none of this information directly. Their peak areas are complex functions of coupling constants and preparation time. Their multiplet structures are different. Their effective coupling constants are different. Also, only the magnitude of the difference of the chemical shifts of two coupled spins is revealed.

Although it is conceivable that new analytical methods might be developed to allow ready extraction of information from zero-quantum spectra as from their single-quantum counterparts, the complexity of such a task, given the complex relationships between the coupling constants, peak areas, chemical shifts etc. of the two would seem to make such a development unlikely.

As NMR analysis has developed around and centered upon single-quantum spectra the most useful methods of obtaining spectral information in inhomogeneous magnetic fields are likely to be those which provide single-quantum parameters in the most directly accessible way. The single-quantum J-resolved broad-band decoupled zero-quantum experiment comes considerably nearer to this goal than the conventional zero-quantum experiment. This is because it replaces the effective zero-quantum coupling constants and multiplet structures with the single-quantum coupling constants and multiplet structures of those spins active in a given zero-quantum coherence. Besides making accessible the information inherent within these parameters it also means that scalar coupling networks oan be easily traced. This is because a spin active in two different zero-quantum coherences will give rise to the same multiplet structure on one peak for each coherence. This is demonstrated for L-threonine in FIG. 2.17 A. The presence of the octet, though incompletely resolved, on one peak of each zero-quantum coherence indicates the connectivity. Hence the spin system may be readily deduced. The two doublets have different coupling constants and so do not result from the same spin.

A large part of the analysis of single-quantum spectra is based upon chemical shifts; methylene protons resonate in one region of the spectrum, aromatic protons in another, etc. This information would seem to be lacking in a zero-quantum spectrum which only presents one with the difference in chemical shifts. A zero-quantum frequency of a given magnitude may correspond to a coupling between two spins separated by that frequency in any number of regions in the single-quantum spectrum. Hence one is given a much less certain idea as to their identity. If only one could tell from the single-quantum J-resolved broad-band decoupled zero-quantum spectrum which of the two multiplets on a given coherence was, say, downfield of the other it would allow one to accurately reassemble from this experiment the complete single-quantum spectrum except for singlets and a reference such as TMS.

From equations 2.16 and 2.17 it can be seen that after the pulse $\alpha$ the antiphase single quantum coherence of each spin consists of two types of orthogonal term. One is modulated by $\cos[(\Omega_A-\Omega_X)(t_1-t_d)]$, and the other by $\sin[(\Omega_A-\Omega_X)(t_1-t_d)]$. The first of these is only dependent upon the magnitude of $(\Omega_A-\Omega_X)$, but the second, the sine modulated term, is also dependent upon the sign. Therefore it can be seen that if $\Omega_A<\Omega_X$ the modulation of spin X will have a negative phase modulation with respect to $t_1$ and spin A a positive phase modulated frequency. If $\Omega_A<\Omega_X$ the reverse will be true: spin X will have a positive phase modulation and spin A a negative phase modulation. Consequently the single-quantum multiplet at the negative zero-quantum frequency will always be the most upfield of the two spins and vice versa. The presence of a 180° pulse before acquisition will reverse the signs of all zero-quantum frequencies.

Consequently, with this experiment it is possible to easily reassemble the single-quantum spectrum even in an inhomogeneous magnetic field where obtaining the normal single-quantum spectra is otherwise impossible, except. The exceptions to this are single spins (which do not form zero-quantum coherences) and a reference such as TMS. This is demonstrated in FIG. 2.17 for L-threonine.

One advantage this technique does have over a conventional single-quantum spectrum besides independence of magnetic field inhomogeneities is that any multiplet hidden underneath a singlet such as HDO will now be revealed.

This experiment has three major disadvantages. Firstly, peak areas are complex functions of coupling constant and the length of the preparation period $\tau$. Secondly, the small value of the pulse $\alpha$ necessary to achieve efficient preferential coherence transfer results in the acquired signal having a relatively low intensity which may be reflected in poor S/N. Thirdly, the length of time involved: each experiment takes a minimum time of $(\tau+t_d)$ which may easily amount to 400-500 msec, and in addition, the Nth block of the experiment will contain an additional delay due to J-encoding of $(Nn\Delta t_1)$. This is potentially a major problem if the chemical species of interest have short spin-spin relaxation times.

The Assignment of Zero-Quantum Coherence Spectra in Inhomogeneous Magnetic Fields In this section the assignment of zero-quantum coherence spectra will be discussed with reference to a number of representative amino acids for which the zero-quantum spectra obtained under a standard set of conditions are given.

The assignment of the zero-quantum spectrum of a known compound is potentially trivial if a fully assigned single-quantum spectrum is available. It is only necessary to calculate the difference in resonance frequencies of each pair of coupled spins and to look for a peak at that frequency in the zero-quantum spectrum. For example, the single-quantum spectrum of L-threonine in $D_2O$ has three resonances, at 288 Hz, 347 Hz, and 105 Hz, corresponding to the $\alpha$, $\beta$, and $\gamma$ protons. Consequently, assuming all the protons have mutually resolved scalar couplings, one would expect to find the zero-quantum coherences $\alpha$-$\beta$, $\beta$-$\gamma$, and $\alpha$-$\gamma$ at 59 Hz, 242 Hz, and 183 Hz respectively. The former two coherences occur as predicted (FIG. A2.7). Although it does occur the latter is of relatively low intensity as the coupling constant $J_{\alpha\gamma}$ is small. Small values of $\tau$ and $\tau'$ tend to emphasise zero-quantum coherences between spins with a large mutual coupling constant whereas zero-quantum coherences between more weakly coupled spins will be emphasised by larger values of $\tau$ and $\tau'$. This is because the zero-quantum coherence of two spins is generated from those components of their single-quantum coherence which are antiphase with respect to each other. The rate at which in-phase single-quantum coherence will evolve into antiphase single-quantum coherence with respect to given a spin is dependent upon their mutual coupling constant. Consequently if the coupling constant is large the desired antiphase single-quantum coherence will evolve quickly, and if it is small slowly.

If two or more zero-quantum coherences overlap a knowledge of their frequencies may be insufficient to determine which are present. In this case there are three alternative courses of action.

Firstly, the zero-quantum coherences may have different multiplet structures, in which case, if resolution is sufficient, the coherences present can be determined.

Secondly, by using different values of $\tau$ and $\tau'$, the preparation and refocussing periods, it may be possible to edit out some of the overlapping coherences to simplify the spectrum. For example, the zero-quantum spectrum of L-isoleucine obtained with $\tau$ and $\tau'=60$ msec contains a number of overlapping coherences, FIG. A2.8.A. By changing $\tau$ and $\tau'$ to 100 msec, FIG. A2.8.B, or 140 msec, FIG. A2.8.C, the spectrum is greatly simplified and the overlap of coherences reduced.

Thirdly, the zero-quantum spectrum can be broad-band decoupled to try and resolve coherences whose multiplets overlap. For example, from an examination of the single-quantum spectrum of L-valine one might expect three strong zero-quantum coherences: $\alpha$-$\beta$, $\beta$-$\gamma$, and $\beta$-$\gamma'$ at 107 Hz, 99 Hz, and 94 Hz respectively. The overlap of multiplets in the zero-quantum spectrum makes it impossible to determine which of these coherences are present (FIG. A2.9). Upon broad-band decoupling the zero-quantum spectrum, FIG. 2.19.B, it can be seen that only the $\alpha$-$\beta$ and $\beta$-$\gamma$ coherences are present, although the peaks are incompletely resolved.

What does one do if an assigned single-quantum spectrum is not available? In single-quantum NMR spectroscopy it is often possible to assign a spectrum, partially or wholly, by the use of four types of parameters: chemical shifts, multiplet structures, coupling constants, and peak areas.

Chemical shifts tell one about the environment of a spin within a molecule, whether it is aromatic, adjacent to a heteronucleus etc.

The multiplet structure of a resonance provides information on neighbouring spins; how many spins it is coupled to and whether they are identical or different and hence what kind of spin system it is part of.

Coupling constants tell one about the relative locations of coupled spins, by their magnitude whether a coupling is through two, three, or five bonds, and they may also provide conformational information.

Peak areas tell one how many spins give rise to a particular resonance and are particularly useful when a number of resonances overlap, and facilitate the identification of spin systems.

To what extent is the information summarized above accessible within a zero-quantum coherence spectrum?

Zero-quantum coherences occur at the difference in frequencies of two coupled spins and are therefore found within a narrower frequency range than their single-quantum counterparts. Zero-quantum frequencies are relative rather than absolute and consequently the information which can be extracted from them is also relative. One cannot tell, for example, whether a proton active in a zero-quantum coherence is likely to be aromatic or adjacent to a heteronucleus from its position in the spectrum. One can only tell whether it arises from two spins in a similar environment, hence having similar chemical shifts and giving rise to a small zero-quantum frequency, or between two spins in different environments and hence giving rise to a large zero-quantum frequency.

The multiplet structure of a zero-quantum coherence still provides information on the spin system of which the spins active in the coherence are part, but in a different way from single-quantum coherences. Zero-quantum coherences only exhibit couplings to those spins not active in the coherence and hence give rise to different splitting patterns.

The coupling constants exhibited by zero-quantum coherences often correspond to the difference of two single-quantum coupling constants (equation 2.15) making them more difficult to interpret. A small zero-quantum coupling constant may correspond to the difference of two small or two large single-quantum coupling constants. In the relevant single-quantum coupling constants are very similar the corresponding zero-quantum coupling constant may be unresolved and may even lead to the mutual cancellation of unresolved peaks.

The peak areas of zero-quantum coherences are complex functions of single-quantum coupling constants and the lengths of the preparation and refocussing periods of the zero-quantum experiment. Consequently they cannot easily be used to reveal the number of spins giving rise to a zero-quantum coherence.

Taking these factors into account the information provided by zero-quantum coherences would seem to be more ambiguous and to have a lower content of useful information than their single-quantum counterparts. From the amino acids surveyed it can be seen that the assignment of the zero-quantum spectra of some will be trivial; those which give rise to only one zero-quantum coherence such as L-cysteine (FIG. A2.11), L-alanine (FIG. A2.15), and L-aspartic acid (FIG A2.16). These are all compounds which have only two types of coupled spin and hence produce only one zero-quantum coherence, and are rare instances of zero-quantum spectra being easier to assign than single-quantum ones. Most compounds of interest however give rise to more than one zero-quantum coherence. For a known compound it is possible to calculate the approximate single-quantum resonance frequencies of its spins by the use of chemical shift tables, and hence to calculate the frequencies of zero-quantum coherences from these. Unfortunately chemical shift tables have limited accuracy which is degraded still further when a zero-quantum frequency is calculated. In one typical chemical shift table an accuracy of $\pm 0.2$ ppm is quoted. For a zero-quantum frequency thus calculated the accuracy will be reduced to $\pm 0.28$ ppm, or 22.5 Hz at 80.3 MHz. Although this may be adequate to assign simpler compounds with a few widely dispersed resonances such as L-threonine, for compounds which are only a little more complex it proves to be inadequate. Of the amino acids surveyed over half have coherences which are within 22.5 Hz (0.28 ppm) of each other. For example, L-methionine within the range 30–50 Hz (FIG. A2.2.C), L-glutamic acid within the range 10–40 Hz (FIG. A2.3.B) and L-isoleucine within the range 0–100 Hz (FIG. A2.8.A). To an extent such ambiguities may be removed if the calculated multiplet structures of these coherences are different. This has the prerequisite that the resolution of the zero-quantum spectrum be high enough to resolve the scalar couplings concerned. This is potentially a problem as the coupling constants of zero-quantum coherences may be considerably smaller than their single-quantum counterparts thus leading to ambiguity as to their perceived multiplicity. This problem may be reduced by increasing the resolution of the spectrum, but this would require more time, both in increasing the number of $t_1$ increments used and also in increasing the number of acquisitions per increment needed to attain the same S/N. As the evolution time, $t_1$, increases the extent to which the magnetization will have relaxed before acquisition also increases hence decreasing S/N. This is liable to be problematic, particularly for compounds with short spin-spin relaxation times. In addition to the evolution time, several hundred milliseconds (120–280 msec for the amino acid spectra) may be spent in the preparation and refocussing periods of the experiment. Overlap may also prevent one from determining the multiplicity of a coherence although this problem may be alleviated by changing the lengths of the preparation and refocussing periods as described previously.

In the light of these considerations it would seem that the assignment of zero-quantum spectra, in the absence of any other NMR spectroscopic information, is not a realistic objective, except for the very simplest compounds, with conventional zero-quantum experiments. However, there is an alternative which has been developed herein: the single-quantum J-resolved broad-band decoupled zero-quantum experiment. This experiment produces spectra with many of the features of single-quantum spectra often regarded as essential for the assignment of coherences. Each zero-quantum coherence exhibits the single-quantum multiplets of the two coupled spins which give rise to it—revealing a single-quantum spin-spin connectivity. Also, different zero-quantum coherences which have a spin in common have a multiplet in common. This allows one to extend spin-spin coupling networks through different zero-quantum coherences and hence to determine the specific location within a spin system of the spins active in a particular coherence. With this experiment it may also be possible to identify unknown compounds, or at least the spin systems they contain, by virtue of the fact that their single-quantum spectra can be largely reassembled from the one produced in this experiment. Although the spectral width of the experiment is relatively narrow this can be compensated for. A higher magnetic field can be used, or the spectrum can be edited by varying the length of the preparation period to reduce crowding or overlapping of coherences. Alternatively the J-scaling factor n can be reduced. It should not be forgotten that this experiment does have significant disadvantages which were discussed above.

The Analysis of Mixtures in an Inhomogeneous Magnetic Field by the Recognition of the Zero-Quantum Coherence Signatures of Their Constituents Besides using the spectroscopic parameters contained within the zero-quantum spectrum itself to deduce the identity of the compound giving rise to it it is possible to use zero-quantum spectra in a quite different way. This is done not so much by using the parameters which can be extracted from them but by using the pattern of a spectrum as a whole as it arises under a given set of conditions as a "signature" of the compound producing it. Therefore use is made not only the coherence frequencies and multiplet structures, as one might do in an attempt to assign the spectrum, but also of the relative intensities of coherences as part of the signature which is not practical when attempting to assign the spectrum.

To make use of zero-quantum coherence spectra in this way it is necessary to acquire a catalogue of spectra for the compounds one will come across, or at least for those compounds which one is specifically looking for, in a similar manner to those previously compiled of single-quantum spectra.

The essence of this method has been demonstrated above in FIG. 2.4 where the components of a mixture of amino acids were determined by reference to the previously collected zero-quantum spectra of its individual components to consist of L-alanine, L-threonine, L-valine, and L-asparagine.

To determine the presence of a compound in a mixture by it zero-quantum coherence "signature" unlike assigning a zero-quantum spectrum does not require that all of its coherences be completely resolved from those produced by the other components, but merely that enough are discernible so as to make the determination of its presence or absence unambiguous.

When using the refocussed zero-quantum experiment the values of $\tau$ and $96'$, the lengths of the preparation and refocussing periods, can be varied both to edit out coherences and also to determine the relative intensities of those which are left. In the context of signature recognition this has two uses; to reduce the number of coherences in an overcrowded spectrum hence facilitating the recognition of signatures among the remaining coherences. Also two or more possible components of a mixture produce indistinguishable coherences at the same frequency it may be possible to distinguish between them by the way in which the intensities of the peaks vary with $\tau$ and $\tau'$. The broad-band decoupled zero-quantum experiment can be used in a similar manner. It produces a spectrum which is less prone to overlapping as each coherence is only present as a singlet. This makes the determination of which peaks are present less ambiguous, but it also reduces the amount of information available in that multiplet structure, a useful part of a signature, is removed. By way of compensation there are additional opportunities for editing the spectrum via the length of the evolution time $t_d$. This can be used in a similar manner to $\tau$ and $\tau'$, to suppress unwanted coherences and to determine the relative intensities of those which remain. Additional intensity information can be encoded in the spectrum by varying the angle of the pulse $\alpha$ from 90°. This gives rise to preferential transfer of coherence and hence a spectrum whose intensities are no longer symmetrical about 0.0 Hz. This is potentially a further way of distinguishing between compounds whose resolved coherences are otherwise the same.

To determine the effectiveness of the application of the techniques described above to signature recognition a mixture was made up consisting of several amino acids.

Due to magnetic field inhomogeneity, FIG. 2.18.A, the conventional single-quantum spectrum contained no useful information. The conventional zero-quantum spectrum of the mixture obtained with $\tau,\tau'=60$ msec, FIG. 2.18.B, does not suffer from this drawback. By comparison it is possible to rule out the presence of many of the amino acids within the mixture. With the exception of the small peak at ±230 Hz there are no coherences visible above the noise level in the range ±120 to ±300 Hz. This rules out the presence of L-alanine, L-arginine, L-proline, L-glutamine, L-methionine, L-glutamic acid and L-threonine. Remaining possible constituents are L-aspartic acid, L-$\beta$-phenyl alanine, L-leucine, L-valine, L-cysteine, L-asparagine, L-isoleucine and L-serine. Of these there is evidence to support L-leucine, as the peak at ±230 Hz corresponds to one in the catalogued spectrum of L-leucine (FIG. A2.6.A), and L-valine due to the peaks in the range ±80 to ±120 Hz which resemble those of the L-valine spectrum (FIG. A2.9) although there is clearly overlap with the other components of the mixture. The remaining coherences are of little use due to the extensive degree of overlapping found therein. The corresponding experiment with $\tau$ and $\tau'$ set to 140 msec gives rise to a spectrum with fewer coherences and greatly reduced overlap, FIG. 2.18.C. The absence of peaks in the appropriate regions of this spectrum rule out the presence of L-cysteine (FIG. A2.11), L-β-phenylalanine (FIG. A2.5.C) and L-serine (FIG. A2.13.B). The peak at ±230 Hz has all but disappeared as would be expected if it is due to L-leucine. Many of the peaks in the region ±80 to ±120 Hz have also disappeared as one might expect if they were due to L-valine (FIG. A2.9). The remaining peaks in this region may be due to the overlapping doublets of L-asparagine (FIG. A2.4.C) and L-aspartic acid (FIG. A2.16). The presence of L-asparagine is further suggested by the presence of a peak at ±67 Hz. This leaves as possible components of the mixture L-valine, L-asparagine, L-aspartic acid, L-leucine and L-isoleucine. Of these, fully resolved peaks are observable for L-asparagine and L-leucine, and, of the remainder, possible partially resolved peaks are observed for L-valine and L-aspartic acid although this by itself is insufficient to determine their presence with certainty.

FIG. 2.19. Broad band decoupled zero-quantum spectra of 0.1 molar solutions in $D_2O$ of: A. L-valine, L-leucine, L-asparagine, L-aspartic acid and L-isoleucine. B. L-valine. C. L-leucine. D. L-asparagine. E. L-aspartic acid. F. L-isoleucine. In each case $t_d = 364$ msec, $\tau = 60$ msec, $\Delta t_1 = 1.67$ msec, 256 blocks collected, 8 acquisitions per block.

As the main problem here encountered is one of overlap of coherences the broad-band decoupled zero-quantum spectra was obtained for both the mixture as a whole, FIG. 2.19.A, and also of its possible components, FIGS. 2.19 B–F. In both cases α was set to 45° to take advantage of the resulting unsymmetrical intensity distribution about 0.0 Hz. From inspection of the spectra it can immediately be seen that L-valine, L-leucine and L-isoleucine are present. L-isoleucine went undetected in the conventional zero-quantum spectrum. Whether L-aspartic acid as well as L-asparagine is present is less immediately obvious. The four outer coherences of the L-asparagine spectrum (FIG. 2.19.D) can be identified in the spectrum of the mixture (FIG. 2.19.A), but the frequency of one of these coincides with that of the L-aspartic acid coherence. This makes the presence of the latter ambiguous. However, there is evidence which suggest that L-aspartic acid is present. The most intense peak assignable to L-asparagine on the left hand side of the spectrum is bordered on both sides by two less intense peaks. Although these peaks can all be discerned in FIG. 2.19.A, their relative intensities are not what one would expect from the spectrum of the amino acid. The central of the three peaks has a greater relative intensity than anticipated suggesting that another peak is present at this frequency. This would indeed be the case if L-aspartic acid were present as can be seen from the spectrum of L-aspartic acid, FIG. 2.19.E. Secondly, the relative intensity of the peak at −90 Hz is greater than that at +90 Hz in the spectrum of L-asparagine whereas in the mixture this situation has been reversed, again suggesting the presence of another peak at +90 Hz as well as that due to L-asparagine. Again this indicates the presence of L-aspartic acid as can be seen from its broad-band decoupled zero-quantum spectrum. If α had been set to ±90° it would be impossible to tell which was present from the zero-quantum spectrum. The peaks on either side of those at ±90 Hz would be buried beneath those of L-valine and L-isoleucine and hence unavailable for intensity comparisons, and the intensity of coherences about 0.0 Hz would be symmetrical making any comparison of their relative intensities pointless.

Thus, with the use of conventional and decoupled zero-quantum spectra, making use of relative intensities and preferential transfer of coherence as well as coherence frequencies and multiplet structures it is possible to identify all the components of a complex mixture in an inhomogeneous magnetic field by comparison of spectra of the mixture as whole with those of individual possible components obtained with the same experimental parameters.

Experimental

All spectra, with the exception of those in FIGS. 2.4 and 2.5, were recorded at room temperature using a spectrometer equipped with an Oxford Research Systems 1.89 T, 30 cm horizontal bore magnet and a Nicolet NT-300 console controlled by a Nicolet 1280 computer and a 293C pulse-programmer operating at 80.3 MHz for $^1H$. The samples used were prepared analytically, by accurate weighing where the molarity is given, and by volume with a pipette where the ratio of the components is given. The magnetic field gradients were produced by the shim coils using driving voltages generated by digital-to-analogue converters in the 293C unit. Samples were placed within a 7 cm axial resonator probe. Pulse sequences were readily implementable with the software provided except for those involving decremental delays. The broad-band decoupled zero-quantum experiment and the single-quantum J-resolved broad-band decoupled zero-quantum experiment which both incorporate the decremental delay $(t_d - t_1/2)$ The software did not provide for decremental delays and consequently a delay list had to be used. This was capable of containing up to 32 values, and was used in conjunction with another fixed delay. One value from the delay list was used for each block of the experiment, and when the list was used up the experiment was stopped automatically. Each time the delay list was finished the fixed delay was decremented successively through consecutive integer multiples of the largest delay value in the list. This was done so that when the experiment was run again the values of the decremental time interval would follow on from those previously used instead of repeating them. To allow the experiment to reach equilibrium again after it was restarted after changing the appropriate delay values, the first 6 acquisitions of each block were discarded. In all experiments a sine apodization function was used on the FIDs which were then zero-filled to 2K. For symmetrical spectra (about 0.0 Hz) the spectra were reversed and added to themselves to improve S/N if this was lacking in the original spectrum. Only spectra within the first 2–3 msec of $t_2$, the acquisition time, were co-added to build up S/N due to rapid collapse of the FID resulting from magnetic iield inhomogeneity.

Those experiments reported at 270 MHz (FIGS. 2.4 and 2.5 only) were recorded on a home-built NMR spectrometer based upon an Oxford Instruments superconducting 6.35 T magnet, a Bruker WP-60 console and a Nicolet 1180 computer and a 293B pulse-programmer. The samples used were prepared analytically by accurate weighing and the solvent added by pipette and placed within 5 mm diameter NMR tubes.

Nuclear Magnetic Resonance Imaging

Over the last twenty years NMR has advanced at an almost explosive rate, and for over half of this time NMR imaging has caused not a little of the excitement.

The first account of NMR imaging was published in 1973 by Lauterbur followed shortly by a number of others just two years after Jeener had introduced the concept of the two-dimensional Fourier transformation. It has only been more recently, after the first waves of the 2-D revolution had died down, that NMR imaging has really taken off as a field of research in its own right.

A large part of the interest in NMR imaging has been in relation to biological experiments, though it should be noted that this is not a new phenomenon. Tradition has it that 30 years ago Edward Purcell put his head in a magnet in an attempt to observe the effects of intensive thinking o the NMR signal.

The fundamental idea behind NMR imaging is to encode the observed signal with spatial information. This is done by making the magnetic field strength experienced by a nucleus, and hence its precessional frequency, spatially dependent.

If a linear magnetic field gradient in the x direction, $G_x$, is superimposed upon the static magnetic field $B_o$, and assuming that the magnitude of the magnetic field created by the gradient is much less than $B_o$, the Larmor frequency, $\omega$, of the nucleus becomes:

$$\omega = \gamma B_o + \gamma x G_x \qquad (3.1)$$

On Fourier transformation this would give a frequency spectrum which is a one-dimensional projection of the object of interest taken along the x direction, FIG. 3.1. Clearly one projection of the object is insufficient to define completely the shape of an object and its spatial location. In his first experiments Lauterbur, overcame this problem by rotating the object about an axis perpendicular to the gradient direction. This gave a number of projections from which the image could be reconstructed by the use of back projection techniques. More practically, instead of rotating the object, two gradients can be varied such that:

$$\gamma(xG_x + yG_y) = \omega_k \qquad (3.2)$$

where $\omega_k$ is a constant frequency, to create an arbitrary gradient of constant magnitude in any direction in the plane defined by the two gradients.

The use of projection reconstruction techniques has been superseded by Fourier zeugmatography. This technique makes use of multidimensional Fourier transformations, instead of back projection, to reconstruct the image of an object. Experiments utilising this technique generally involve the phase encoding of all but one of the dimensions of interest, such as x,y, and z, prior to acquisition and the frequency encoding of the remaining dimension during acquisition. Phase encoding may be achieved by incrementing the application time of a gradient of constant magnitude, or by incrementing the amplitude of a gradient applied for a fixed time. The latter method is used herein and will be described below.

If a magnetic field gradient $G_y$ is applied to a sample for a time $t_1$, at the end of that time each spin will have precessed through an angle given by:

$$\Delta\omega = \gamma B_o t_1 + \gamma G_y y t_1 \qquad (3.3)$$

hence the phase change incurred by a spin during $t_1$, $\Delta\omega$, will be dependent upon its y-coordinate. If the experiment is repeated n times incrementing $G_y$ by a constant amount, $\Delta t_1$, each time, then the acquired signal will be dependent upon $G_y$ giving rise to a data matrix $S(G_y, t_2)$. Fourier transformation with respect to $t_2$, the rows of the matrix, will give rise to the frequency spectra corresponding to each value of $G_y$. Fourier transformation with respect to $G_y$, the columns of the matrix, will give rise to the frequency spectra of any observables which caused modulation of the magnetization as a function of $G_y$. As can be seen from equation 3.3 intrinsic chemical shift, the first term in the right half of the equation, is independent of $G_y$ and consequently will not be encoded in this dimension. The phase change occurring during $t_1$ due to a spin y-coordinate on the other hand is clearly dependent upon $G_y$. Consequently this dimension of the data set will, when Fourier transformed, correspond to the spatial coordinate y and hence the spectra obtained will be representative of spin density of the sample in the y direction.

If in addition to a phase encoding gradient, a static gradient is applied during acquisition, leading to frequency encoding of the spatial dimension corresponding to the direction of that gradient (equation 3.1), the resultant two-dimensional spectrum after Fourier transformation will be a spin density map. The phase encoded spatial coordinate will be along F1 and the frequency encoded spatial dimension along F2. The pulse sequence for this experiment is given in FIG. 3.2. It can be seen from equation 3.1 that chemical shift as well as the spatially dependent frequency variation induced by the static magnetic field gradient will be encoded during acquisition. Consequently, if the image is not to be distorted, the static gradient must be sufficiently large to make chemical shift frequenc differences negligible compared with the gradient induced spatially-dependent frequency-variation.

Chemical Shift Resolved Imaging

Chemical shift resolved imaging experiments are those imaging experiments which besides containing spatial dimensions also have an intrinsic chemical shift dimension Although localised high resolution spectra can be obtained with such techniques as those utilising surface coilsfield, profiling and the sensitive point method these methods are impractical for obtaining chemical shift resolved images either due to the time required, low sensitivity, or other technical limitations.

The first chemical shift resolved imaging experiment proposed by Lauterbur was based upon projection reconstruction, though the currently most widely used methods are variations on the Fourier zeugmatography experiment. This experiment, introduced by Ernst, uses multidimensional Fourier transformations to reconstruct an image. In one of the more common of its forms, this experiment uses two or three phase encoding gradients to encode the spatial dimensions of the data set. During acquisition all gradients are switched off and the chemical shift spectrum is acquired, FIG. 3.3. A 180° pulse is included to refocus dephasing due to magnetic field inhomogeneities. The image is obtained by Fourier transforming all dimensions. The chemical shift dimension will be F2. Due to the substantial acquisition and processing time involved in multidimensional experiments a total of three dimensions, x,y, and chemical shift are usually acquired. Slice selection techniques are used to select a slice through the remaining dimension. They do this by ensuring that only those spins within a certain narrow range along the remaining dimension are excited. A slice taken through the data set obtained orthogonal to the chemical shift axis at the resonance frequency of a chemical species will yield the image of that species.

Unfortunately the degree of magnetic field homogeneity required to obtain high resolution chemical shift spectra, which is of the order of 1 part in $10^7$ is currently only attainable in volumes of approximatly 10 cm in diameter. The objects which it is desired to image, such as human beings, are often somewhat larger. Consequently the resolution obtained in chemical shift resolved images is typically as poor as 2 ppm, adequate to distinguish fat from water but little else.

A partial solution to this problem is to map the magnetic field distribution. Assuming that the distribution is static, this information can be used to generate a curved instead of planar slice through the chemical shift axis thus compensating for irregularities in magnetic field distribution.

Zero-Quantum Coherence Resolved Imaging

The major drawback to chemical shift resolved imaging experiments, as discussed above, is the technically demanding requirement for $B_o$-field homogeneity to exceed 1 part in $10^7$ over the volume of interest. It does not seem realistic at the present time to expect this requirement to become technically feasible on a routine basis in the near future. Consequently alternative solutions are needed, experiments which while still allowing the separation of the spin density images of diiferent spin systems are not fatally susceptible to magnetic field inhomogeneities as are all currently used chemical shift resolved imaging experiments.

The basic requirement of such an experiment would be that it produce a data set which encodes in one dimension some property which is a function of the spin system producing it. It must also be independent of magnetic field inhomogeneity. An obvious candidate would seem to be zero-quantum coherence as it fulfills both of these requirements.

Zero-quantum coherence cannot be directly observed. Consequently it cannot be encoded during acquisition as is the case with chemical shift in many chemical shift resolved imaging experiments. Therefore it would seem logical to frequency encode one of the spatial dimensions during acquisition and to modulate the magnetization prior to acquisition with respect to the remaining spatial dimensions and zero-quantum coherence. The spatial dimensions may be encoded as a function of an incremental gradient, and zero-quantum coherence may be encoded as a function of an incremental time $t_1$. An incremental gradient encodes a spatial coordinate by phase encoding (equation 3.3), and to convert zero-quantum coherence into single-quantum coherence most efficiently requires a 90° pulse which implies amplitude modulation (equation 2.15). Consequently it does not make sense to phase encode the magnetization (spatial encoding) before amplitude encoding (zero-quantum coherence encoding) as the latter destroys the sense of phase ($\pm$) of the former.

Therefore the magnetization must first be amplitude modulated to encode zero-quantum coherence during an incremental time $t_1$. Then it must be phase encoded with incremental gradients to encode all but one of the spatial dimensions, and lastly frequency encoded in the remaining spatial dimension by a static gradient during acquisition. The antiphase single-quantum coherence originating from zero-quantum coherence must be allowed to rephase before it can be detected so it would seem to make sense to phase encode the magnetization while this is occurring and to include, as in the refocussed zero-quantum experiment, a refocussing pulse to cancel out dephasing due to magnetic field inhomogeneities. It would also be desirable to collect the whole echo instead of just starting to acquire at the top of the echo as this will improve S/N and resolution.

The pulse sequence to which these considerations would logically seem to lead one, is given in FIG. 3.4. This experiment will give rise to a data set $S(t_1,G_y,t_2)$.

Only the $t_2$ dimension of the data set will be subject to distortions by magnetic field inhomogeneities. The phase encoding gradient is applied for a constant time (only the amplitude is incremented) and consequently there will be no modulation of the $G_y$ dimension due to inhomogeneities. Zero-quantum coherences are unaffected by them.

If three spatial dimensions are required, the z-gradient may also be used for phase encoding at the same time that the y-gradient is. If this is done they must be incremented independently, and zero-order multiple-quantum coherence selected by phase cycling. A two-dimensional slice image at a particular value of the third unencoded spatial dimension can be obtained by the use of existing slice selection techniques. These work by ensuring that only the spins in a slice a few millimeters thick at the desired coordinate in the unencoded dimension are excited by a given radiofrequency pulse, and would require only minor alterations to the experiment. The first normal (i.e. hard) 90° pulse is replaced by a soft pulse which will excite a much narrower frequency range than the normal hard pulse would. During the soft pulse a slice selection gradient corresponding to the unencoded dimension is switched on to make the resonance frequencies of the spins spatially dependent. Consequently the narrow range of frequencies excited by the soft pulse corresponds to a range in the unencoded dimension, the spatial coordinate of which is dependent upon the transmitter frequency. The thickness of the slice is dependent upon the magnitude of the gradient and the characteristics of the soft pulse. The slice selection gradient must be sufficiently large that the frequency differences of the spins due to chemical shifts and magnetic field inhomogeneities are negligible relative to those induced by the gradient (equation 3.1).

It is possible to reduce the three dimensional experiment to two dimensions by incrementing the phase encoding gradient simultaneously with $t_1$, instead of independently. This gives rise to a two-dimensional data set in which the phase encoded spatial dimension and the zero-quantum coherence dimension become parallel along one axis, and the frequency encoded spatial dimension is along the other. Effectively this results in the image of a species being superimposed on top of its zero-quantum coherence. Due to the limited ability of the computer used to handle multidimensional data this version of the experiment was performed.

The experiment was demonstrated with a phantom comprising seven vials containing propionic acid, 2-propanol, and water, FIG. 3.5.A. The zero-quantum coherence resolved image of the phantom is given in FIG. 3.5 B. The images of 2-propanol and propionic acid are completely resolved and are superimposed on top of their zero-qUantum coherences. Magnetization which was longitudinal during $t_1$, and hence was not modulated with respect to it, produced a conventional image centred at 0.0 Hz in F1. This magnetization originated from single spins such as water, 2-propanol and propionic acid which was not converted into zero-quantum coherence, and spin-lattice relaxation of zero-quantum coherence. A similar complete resolution of these chemical species would have been impossible with the traditional chemical shift resolved imaging experiment given the magnetic field inhomogeneity evident in the corresponding single-quantum spectrum of the phantom, FIG. 3.5.D.

It should be noted that in the two-dimensional version of the experiment demonstrated here there is distortion of the image in F1 resulting from the multiplet structure off the zero-quantum coherences. This structure is readily discernible, particularly in the case of propionic acid in FIG. 3.5.B. In the three and four dimensional versions of the experiment multiplet structure is confined to the zero-quantum coherence dimension. A slice taken through the data se orthogonal to the zero-quantum coherence axis at the frequency of a certain zero-quantum coherence, will yield the spin density image of the chemical species producing it.

In the conventional chemical shift resolved imaging experiment a slice taken through the chemical shift dimension at a specific resonance may be non-planar due to spatial $B_o$ inhomogeneity, FIG. 3.6.A. Although this may be compensated for by data manipulation the problem does not arise with zero-quantum coherence resolved imaging, FIG. 3.6.B, as it is independent of magnetic field inhomogeneity.

As described previously the zero-quantum coherence dimension can be edited, which is particularly useful in preventing overlapping of images in the two-dimensional experiment. This is because the efficiency of excitation of zero-quantum coherence is dependent upon the length of the preparation period $\tau$ and the scalar coupling constants involved. Editing may also be useful in the three and four dimensional experiments in cases where coherences overlap which may become a considerable problem at lower $B_o$ fields. Alternatively the use of "accordion" preparation and refocussing sequences will ensure a fairly even excitation of all zero-quantum coherences although at the cost of reduced signal intensity and hence S/N Broad-Band Decoupled Zero-Quantum Coherence Resolved Imaging The zero-quantum coherence dimension of a zero-quantum coherence resolved image has in common with conventional zero-quantum spectra a number of disadvantages relative to their single-quantum counterparts. Occurring as they do only at the difference in frequencies of two coupled spins they generally occupy a narrower frequency range. Hence they are more inclined to be crowded and to overlap. This may lead to problems when trying to assign spectra, when trying to separate the spin density images of two overlapping coherences, and overlapping may lead to mutual cancellation of coherences.

A possible solution to all of these problems would be to broad-band decouple the zero-quantum coherence dimension of the experiment. As discussed previously reducing the zero-quantum coherence multiplets to singlets would decrease overlap, reduce mutual cancellation of peaks and may require lower resolution and hence less acquisition time. If all the intensity of a former multiplet now goes into one peak, fewer acquisitions per block may be required to build up an acceptable level of S/N.

A broad-band decoupled zero-quantum coherence resolved imaging experiment can be constructed in a similar manner to the undecoupled zero-quantum coherence resolved imaging experiment discussed previously. This is done by the addition to the existing spectroscopic experiment of gradients during the refocussing and acquisition times to encode the desired spatial dimensions. Also, in analogy to the undecoupled zero-quantum coherence resolved imaging experiment, the whole spin echo is acquired instead of just the second half starting at the top of the echo. This improves the S/N and resolution of the image. The resulting imaging experiment is given in FIG. 3.7. As with the undecoupled experiment it can be used to produce a four, three, or two-dimensional data set. In the four dimensional experiment one encodes broad-band decoupled zero-quantum coherence and also the three spatial dimensions, x, y, and z, using two phase and one frequency encoding gradients. In the three-dimensional experiment only two spatial dimensions are encoded, one by a frequency and one by a phase encoding gradient. If desired, a slice may be selected through the third unencoded spatial dimension by replacing the first hard 90° pulse with a soft pulse and a slice selection gradient as described previously. In the two-dimensional experiment the acquired signal is still encoded with two spatial dimensions and broad-band decoupled zero-quantum coherence but the incremental delay $t_1$, which leads to zero-quantum coherence encoding, and the phase encoding gradient are incremented simultaneously instead of independently. This gives rise to a two-dimensional data set with one dimension modulated due to the frequency encoding and the other modulated due to both broad-band decoupled zero-quantum coherence and the phase encoded spatial dimension. When Fourier transformed in both dimensions, this data set gives rise to an image in which the image of a chemical species will be superimposed on top of its zero-quantum coherences. It is in the two-dimensional version of the experiment that the ability to broad-band decouple zero-quantum coherence is most significant. In the absence of decoupling distortions are introduced into the image by the presence of the zero-quantum coherence multiplet structure. This distortion can clearly be seen in FIG. 3.8.A which consists of the zero-quantum coherence resolved image of a phantom of six vials of 1:1 2-propanol and ethanol in $D_2O$ arranged in a hexagon. 2-Propanol and ethanol produce zero-quantum coherences at similar frequencies. Consequently when their respective images are superimposed on top of their zero-quantum coherences it results in their images overlapping. The additional distortions introduced by the zero-quantum coherence multiplet structure makes it almost impossible to distinguish the shape of the phantom and its consistent vials and leads to considerable merging of peaks. The broad-band decoupled experiment was used to obtain the corresponding decoupled image of the phantom, FIG. 3.8.B. In shape of the phantom is much more readily determined as are the shapes of its constituent vials and the merging of peaks has been greatly reduced. Despite this improvement in resolution the images of the two spin systems still overlap. This is one of the biggest disadvantages of the two-dimensional experiment.

As was discussed previously the broad-band decoupled experiment is more flexible with regards to spectral editing than the conventional zero-quantum experiment, and this is equally an attribute of the imaging experiment. By altering the value of $t_d$ it is possible to edit out unwanted coherences, and hence the images associated with them. This is demonstrated in FIGS. 3.8 C and D where 2-propanol and ethanol respectively have been edited out leaving the undistorted image of the remaining coherence. The corresponding zero-quantum spectra are given in FIG. 3.9.

In addition to distorting the shape of the image the presence of multiplet structure was also found to distort its intensity in the two-dimensional experiment. It can be seen from the cross sections taken through the image in FIG. 3.7. A which are given in FIGS. 3.8 B and C that this distortion makes the experiment practically useless for determining the relative intensities, and hence spin densities, of a particular species. The broad-band decoupled experiment however does not experience this problem as can be seen from taken from the images in FIGS. 3.8 B-D given in FIGS. 3.10 D-I.

The relative spin densities of different chemical species are even more difficult to determine with the broad-band decoupled zero-quantum experiment than for its undecoupled counterpart. In the latter case the intensity of a coherence is a function of the relevant coupling constants and the preparation and refocussing times. In the former case it is additionally dependent upon $t_d$.

The biggest disadvantage of the broad-band decoupled zero-quantum coherence resolved imaging experiment which applies to a significant but lesser extent to the undecoupled experiment is the time involved. In both experiments up to 200 msec may be taken up by the preparation and refocussing periods alone. With the the broad-band decoupled experiment every experiment is longer by at least $n\Delta t_1$ (as $t_d \geq n\Delta t_1$) where n is the number of $t_1$ increments used. These considerations would seem to make in vivo applications of these experiments impractical, given the short spin-spin relaxation times encountered therein.

J-Resolved Imaging

The homonuclear two-dimensional J-resolved experiment shares one important attribute with homonuclear zero-quantum coherence experiments, independence of magnetic field inhomogeneity in the F1 dimension.

Why is this so? Like any other property, if it is to be encoded in the $t_1$ dimension of a two-dimensional experiment the extent to which magnetization evolves due to magnetic field inhomogeneity must change in each successive experiment as a function of an incremental delay or some other property being systematically incremented. This produces a two-dimensional data matrix in which the magnetization in the dimension corresponding to the systematically incremented delay or other variable is modulated by the property one desires to encode.

In the basic homonuclear two-dimension J-resolved experiment, FIG. 3.11.A, at the end of the evolution time $t_1$ the system has only evolved due to its scalar couplings. Chemical shift and magnetic field inhomogeneity are canceled out by the 180° pulse in the middle of $t_1$. Consequently the $t_1$ dimension of the data set will only be phase modulated as a function of the extent of evolution due to scalar couplings. This is demonstrated for the $^{31}P$ spectra of adenosine triphosphate and adenosine diphosphate in FIGS. 3.12 A and B which are clearly unaffected by magnetic field inhomogeneity whereas the corresponding single-quantum coherence spectra, FIGS. 3.12 C and D, are, their scalar couplings being unresolved. Only the $t_1$ dimension of the data set acquired, $S(t_1,t_2)$, has been Fourier transformed, giving $S(F_1,t_2)$. In the case of extreme inhomogeneity F2 will contain no useful chemical shift or scalar coupling information.

Incorporated into an imaging experiment instead of a chemical shift resolved dimension J-encoding would therefore allow one to obtain the image of a chemical species where the magnetic field is too inhomogeneous for a chemital shift resolved image to be useful.

It was found to be insufficient merely to add frequency and phase encoding magnetic field gradients to encode the desired spatial dimensions to the existing two-dimensional J-resolved experiment. This was because the rapid decay of the FID under the influences of the frequency encoding gradient and magnetic field inhomogeneity resulted in inadequate resolution and S/N. This problem was overcome by designing a pulse sequence in which the whole echo is acquired, instead of just the second half, and which yet retains independence of magnetic iield inhomogeneity with respect to $t_1$. The resulting experiment is given in FIG. 3.11.B. Beginning data acquisition within the incremental time $t_1$ would result in magnetic field inhomogeneity and chemical shift being encoded with respect to $t_1$ along with scalar coupling evolution. Therefore an addition time period $\tau/2$ was introduced before the 180° pulse and $\tau$ set equal to the acquisition time. This results in the acquisition of the whole spin echo which reaches its maximum at the centre of the FID giving rise to maximum resolution and S/N without introducing magnetic field inhomogeneity into the F1 dimension of the image.

This sequence was initially evaluated with a phantom containing ethanol, propionic acid and 2-propanol in water. Only one spatial dimension was encoded, with a frequency encoding gradient during acquisition. The other dimension was J-encoded. The experiment was found to be inadequate. Short $T_2$'s together with the relatively small sizes of most proton-proton coupling constants limited the resolution obtainable in F1. The necessity of using the absolute value mode of display due to phase distortions which made automatic phase correction impossible, also helped to make it unfeasible to separate out the different constituents (by taking slices through the F1 dimension of the image). This problem may be exacerbated by the large number of multiplets associated with many compounds which may lead to significant overlapping of peaks in the F1 dimension.

A phantom consisting of a row of six vials containing adenosine triphosphate and adenosine diphosphate was constructed, and aligned parallel to the direction of the x-gradient. Observing $^{31}P$, and again using only a frequency encoding gradient the experiment was repeated. Phosphorus-phosphorus coupling constants are considerably larger than their proton counterparts. Consequently they could be expected to be better resolved. As only ATP and ADP of those phosphorus compounds found in vivo are other than singlets, the J-resolved dimension of the experiment may be expected to be less susceptible to peak overlap. The resulting image is given in FIG. 3.13. Unfortunately the $T_2$'s of ADP were found to be short, and this, combined with the sine apodisation function used in the F1 dimension of the data set resulted in its absence from the image. The shortness of the spin-spin relaxation time of ADP relative to ATP is reflected in the relatively poor S/N of ADP to ATP in FIGS. 3.12 A and B. The separation of the doublet and triplet in the F2 dimension is due to the difference in chemical shifts between two of the phosphorus peaks of ATP (20 ppm) which the magnitude of the frequency encoding gradient used was insufficient to overcome.

Clearly, although the experiment works it suffers from severe limitations in terms of the resolution required and that actually obtainable, and, particularly with protons, significant overlap of multiplets of different chemical species. In cases where it does work, such as phosphorus, the chemical shifts encountered are large enough to make chemical shift resolved imaging experiments adequate in all but cases of extreme magnetic field inhomogeneity. Consequently this experiment would seem to be redundant.

Experimental

The spectrometer used was that based upon a 1.98 T magnet described previously.

The software used to generate the incremental gradients for the zero-quantum coherence resolved imaging experiment was found to be inadequate for the broad band decoupled zero-quantum coherence resolved imaging experiment as it did not allow one to choose the initial value of the incremented gradient. This is essential for this experiment as it has to be acquired in sets of 32 blocks on this spectrometer. Consequently, every time the experiment is restarted the incremental gradient started at the same initial value, repeating itself, instead of carrying on from where it had left off at the end of the previous set of 32 blocks. This problem was overcome by constructing an incremental gradient with a time delay of constant length which itself consisted of two delays. One was decremental, and one was incremental. Both were changed from block to block by the same amount, hence keeping the overall time of the two constant. During the incremental delay a positive gradient was switched on, and during the decremental delay the same gradient was inverted, though its magnitude was kept constant. This has the same effect as using an incremental gradient, producing an "increment equivalent" dependent upon the magnitude of the gradient and the size of the increment/decrement of the two delays used. The delays used were the same as those used to effect the incremental and decremental delays within the evolution time $t_d$ of the experiment and consequently required no additional manipulation of parameters between sets of 32 blocks to ensure continuity.

We claim:

1. A method of obtaining zero-quantum coherence resolved images and spectra from a spin system substance in an inhomogeneous or low homogeneity magnetic field which comprises applying to the substance a pulse and spatial encoding sequence.

2. A method of obtaining zero-quantum coherence resolved images and spectra from a spin system substance in an inhomogeneous or low homogeneity magnetic field by a pulse and spatial encoding sequence which comprises:
    (a) during a substance preparation phase, applying a pulse field-gradient which destroys all multiple-quantum coherences, leaving only zero-quantum coherences;
    (b) allowing the zero-quantum coherences to evolve for a period of time sufficient to enable them to obtain information from their surrounding environment;
    (c) applying a pulse to communicate the information to a single quantum space;
    (d) applying spatial encoding to the information to provide a map reflecting the spatial distribution of the original spins of the substance.

3. A method as defined in claim 2 wherein the magnetization of the pulse to communicate is amplitude modulated to encode zero-quantum coherence during an incremental time.

4. A method as defined in claim 3 wherein the magnetization is then phase encoded with incremental gradients to encode all but one of the spatial dimensions.

5. A method as defined in claim 4 wherein the magnetization is frequency encoded in the remaining spatial dimension by a static gradient during acquisition.

6. A method as defined in claim 5 wherein the zero-quantum coherences rephase during the evolution phase.

7. A method as defined in claim 6 wherein the magnetization is phase encoded while the zero-quantum coherence is rephasing.

8. A method as defined in claim 7 wherein a refocussing pulse is included to cancel dephasing due to magnetic field inhomogeneities.

* * * * *

UNITED STATES PATENT AND TRADEMARK OFFICE
CERTIFICATE OF CORRECTION

PATENT NO. : 4,703,270

DATED : October 27, 1987

INVENTOR(S) : Lawrence D. Hall et al.

It is certified that error appears in the above-identified patent and that said Letters Patent is hereby corrected as shown below:

Col. 4, Line 5    Change "metod" to --method--;

Line 6    Change "thoses" to --those--;

Line 13   After "D$_2$O," insert --all concentrations 0.1 molar. A. Single-quantum spectrum. Zero- --;

Line 25   Change "jof" to --of--.

Col. 5, Line 12   Change "corresonding" to --corresponding--;

Line 14   After "zero-quantum" delete --quantum--;

Line 31   Change "Homoucler" to --Homonuclear--;

Line 35   Change "$^{31}$p" to --$^{31}$P--.

Col. 7, Line 23   Change "wiII" to --will--;

Line 25   Change "single-quanum" to --single-quantum--;

Line 60   Change "4IAzIXyIXy" to --$4I_{Az}I_{Xy}I_{Xy}$--;

Line 62   Change "wiII" to --will--;

Line 62   Change "evolve" to --evolve--;

Line 63   Change "durin9" to --during--;

Line 64   Change "sin9le-quantum" to --single-quantum--.

UNITED STATES PATENT AND TRADEMARK OFFICE
CERTIFICATE OF CORRECTION

PATENT NO. : 4,703,270

DATED : October 27, 1987

INVENTOR(S) : Lawrence D. Hall et al.

It is certified that error appears in the above-identified patent and that said Letters Patent is hereby corrected as shown below:

Col. 8, Line 2    Change "byr" to --by--;

Line 54    Change "ooherances" to --coherences--;

Line 54    Change "wiIl" to --will--.

Col. 9, Line 24    Change "oi" to --of--;

Line 48    After "exceptions" insert --.--;

Line 62    Change "time." to --time--.

Col. 10, Line 4    Change "iS" to --is--

Line 10    Change "oi" to --of--;

Line 24    Change "upo" to --upon--;

Line 31    Change "ior" to --for--;

Line 38    Change "r+nt$_1$" to --$\tau$+nt$_1$--;

Line 40    Change "So" to --so--;

Line 52    Change "oi" to --of--;

Line 66    Change "uniiform" to --uniform--.

Col. 11, Line 6    Change "reiocussed" to --refocussed--;

Line 8    Change "preparatio" to --preparation--;

UNITED STATES PATENT AND TRADEMARK OFFICE
CERTIFICATE OF CORRECTION

PATENT NO. : 4,703,270
DATED : October 27, 1987
INVENTOR(S) : Lawrence D. Hall et al.

It is certified that error appears in the above-identified patent and that said Letters Patent is hereby corrected as shown below:

| | | |
|---|---|---|
| Col. 11, | Line 24 | Change "resonanor" to resonance--; |
| | Line 26 | Change "easiIy" to --easily--; |
| | Line 34 | Change "oi" to --of--; |
| | Line 38 | Change "sampler" to --simpler--; |
| | Line 41 | Change "Bequenoe" to --sequence--; |
| | Line 43 | Change "zero-quantu" to --zero-quantum--; |
| | Line 53 | Change "oi" to --of--; |
| | Line 62 | Change "zero-luantum" to --zero-quantum--; |
| | Line 65 | Change "couplin9s" to --couplings--. |
| Col. 12, | Line 1 | Change "Thereiore" to --Therefore--; |
| | Line 13 | Change "oi" to --of--; |
| | Line 21 | Change "irom" to --from--; |
| | Line 27 | Change "thereiore" to --therefore--; |
| | Line 52 | Change "ior" to --for--; |
| | Lines 60-61 | Change "constacts" to --constants--; |
| | Line 66 | Change "efiects" to --effects--. |

UNITED STATES PATENT AND TRADEMARK OFFICE
CERTIFICATE OF CORRECTION

PATENT NO. : 4,703,270
DATED : October 27, 1987
INVENTOR(S) : Lawrence D. Hall et al.

It is certified that error appears in the above-identified patent and that said Letters Patent is hereby corrected as shown below:

| | | |
|---|---|---|
| Col. 13, | Line 24 | Change "oi" to --of-- in both occurrences; |
| | Line 26 | Change "ior" to --for--; |
| | Line 26 | Change "oi" to --of--; |
| | Line 46 | Change "4Ihd" to --4I--. |
| Col. 14, | Table III | In the third column, the second entry should read $--2I_{Az}I_{Xx}\sin^2\alpha--$; |
| | Table III | In the third column, the seventh entry should read $--4I_{Ax}I_{Xy}I_{Xy}\cos\alpha\sin\alpha--$. |
| Col. 15, | Line 13 | Change "Sinqle-Quantum" to --Single-Quantum--; |
| | Line 48 | Change "selectivly" to --selectively--. |
| Col. 16, | Line 40 | The equation should begin with a "-"; |
| | Line 42 | The equation should begin with a "-"; |
| | Line 56 | Change "diiierent" to --different--. |
| Col. 19, | Line 19 | Change "oan" to --can--; |
| | Line 54 | Change "$\Omega_A<\Omega_X$" to $--\Omega_A>\Omega_X--$. |
| Col. 22, | Line 7 | Change "In" to --If--. |
| Col. 24, | Line 9 | Change "96'" to --$\tau$--. |

UNITED STATES PATENT AND TRADEMARK OFFICE
CERTIFICATE OF CORRECTION

PATENT NO. : 4,703,270
DATED : October 27, 1987
INVENTOR(S) : Lawrence D. Hall et al.

It is certified that error appears in the above-identified patent and that said Letters Patent is hereby corrected as shown below:

| | | |
|---|---|---|
| Col. 25, | Line 33 | Change "unsummetrical" to --unsymmetrical--; |
| | Line 63 | Change "±90°" to --90°--. |
| Col. 26, | Line 56 | Change "iield" to --field--. |
| Col. 27, | Line 13 | Change "o" to --on--. |
| Col. 28, | Line 31 | Change "frequenc" to --frequency--; |
| | Line 39 | After "dimension" add a period; |
| | Line 42 | Change "coilsfield, profiling" to --coils, field profiling,--. |
| Col. 29, | Line 27 | Change "diiferent" to --different--. |
| Col. 30, | Line 62 | Change "zero-qUantum" to --zero-quantum--. |
| Col. 31, | Line 15 | Change "se" to --set--. |

UNITED STATES PATENT AND TRADEMARK OFFICE
CERTIFICATE OF CORRECTION

PATENT NO. : 4,703,270

DATED : October 27, 1987

INVENTOR(S) : Lawrence D. Hall et al.

It is certified that error appears in the above-identified patent and that said Letters Patent is hereby corrected as shown below:

Col. 33, Line 7  Change "irom" to --from--;

Line 28  After "the" delete --the--.

Col. 34  Line 5  Change "chemital" to --chemical--;

Line 16  Change "iield" to --field--.

Signed and Sealed this

Twenty-third Day of May, 1989

Attest:

Attesting Officer

DONALD J. QUIGG

Commissioner of Patents and Trademarks